US006526559B2

(12) United States Patent
Schiefele et al.

(10) Patent No.: US 6,526,559 B2
(45) Date of Patent: Feb. 25, 2003

(54) METHOD FOR CREATING CIRCUIT REDUNDANCY IN PROGRAMMABLE LOGIC DEVICES

(75) Inventors: Walter P. Schiefele, Sebastian, FL (US); Robert O. Krueger, Laurel, MD (US)

(73) Assignee: Interface & Control Systems, Inc., Columbia, MD (US)

( * ) Notice: Subject to any disclaimer, the term of this patent is extended or adjusted under 35 U.S.C. 154(b) by 113 days.

(21) Appl. No.: 09/833,712

(22) Filed: Apr. 13, 2001

(65) Prior Publication Data
US 2002/0157071 A1 Oct. 24, 2002

(51) Int. Cl.[7] ................ G06F 17/50; G06F 15/177; G06F 9/24; H01L 25/00; H03K 19/177
(52) U.S. Cl. ................ 716/16; 716/6; 716/18; 713/1; 713/100; 710/10; 326/41; 326/47; 326/101
(58) Field of Search ............ 716/1–18; 326/37–51; 326/101–103; 713/1–100; 710/8–14

(56) References Cited

U.S. PATENT DOCUMENTS

| 5,583,450 A | * | 12/1996 | Trimberger et al. | 326/41 |
| 5,600,263 A | | 2/1997 | Trimberger et al. | 326/39 |
| 5,629,637 A | | 5/1997 | Trimberger et al. | 326/93 |
| 5,646,545 A | | 7/1997 | Trimberger et al. | 326/38 |
| 5,654,997 A | | 8/1997 | Brownell et al. | 378/117 |
| 5,701,441 A | | 12/1997 | Trimberger | 716/16 |
| 5,745,268 A | | 4/1998 | Eastvold et al. | 259/110 |
| 5,756,981 A | | 5/1998 | Roustaei et al. | 235/462.42 |
| 5,761,483 A | | 6/1998 | Trimberger | 716/2 |
| 5,825,662 A | | 10/1998 | Trimberger | 716/3 |
| 5,838,584 A | | 11/1998 | Kazarian | 716/16 |
| 5,838,954 A | | 11/1998 | Trimberger | 716/16 |
| 5,959,881 A | | 9/1999 | Trimberger et al. | 365/182 |
| 5,978,260 A | | 11/1999 | Trimberger et al. | 365/182 |
| 5,995,874 A | | 11/1999 | Borza | 607/61 |
| 6,009,542 A | | 12/1999 | Koller et al. | 714/53 |
| 6,034,538 A | | 3/2000 | Abramovici | 326/38 |
| 6,058,330 A | | 5/2000 | Borza | 607/61 |
| 6,072,994 A | | 6/2000 | Phillips et al. | 455/84 |
| 6,080,204 A | | 6/2000 | Mendel | 716/7 |
| 6,091,258 A | | 7/2000 | McClintock et al. | 326/10 |
| 6,102,964 A | | 8/2000 | Tse et al. | 716/18 |
| 6,104,211 A | | 8/2000 | Alfke | 326/91 |
| 6,105,105 A | | 8/2000 | Trimberger | 711/103 |
| 6,263,430 B1 | * | 7/2001 | Trimberger et al. | 713/1 |
| 6,480,954 B2 | * | 11/2002 | Trimberger et al. | 713/1 |
| 2002/0010853 A1 | * | 1/2002 | Trimberger et al. | 713/1 |

OTHER PUBLICATIONS

Lin et al., "Time–multiplexed routing resources for FPGA design", Proceedings of the IEEE 1996 Custom Integrated Circuit Conference, May 05, 1996, pp. 152–155.*

Tessier, "Incremental compilation for logic emulation", IEEE International Workshop on Rapid System Prototyping, Jun. 16, 1999, pp. 236–241.*

Su et al., "A phase assignment method for virtual–wire–based hardware emulation", IEEE Transactions on Computer–Aided Design of Integrated Circuits and Systems, vol. 16, No. 7, Jul. 1997, pp. 776–783.*

* cited by examiner

Primary Examiner—Matthew Smith
Assistant Examiner—Phallaka Kik
(74) Attorney, Agent, or Firm—Rosenberg, Klein & Lee

(57) ABSTRACT

In a field programmable gate array (FPGA) allowing dynamic reconfiguration in time multiplexing fashion, duplicate copies are configured in a time multiplexing manner which are functionally identical to a primary circuit specified for a predetermined FPGA's application. The primary and duplicate circuits are interrogated by a voting circuit which determines the existence of a faulted circuit in order to eliminate the faulted circuit from the operation of the FPGA. In this manner, without physical addition of redundant circuits, fault tolerance for the FPGA is provided to minimize the cost, weight, volume, heat and energy associated issues of conventional redundance techniques.

47 Claims, 20 Drawing Sheets

|       | $e_0$ | $e_1$ | $e_2$ | $e_3$ | $e_4$ |
|-------|-------|-------|-------|-------|-------|
| $e_0$ | 1.0   | .2    | .9    | .2    | .05   |
| $e_1$ | .2    | 1.0   | 0     | 0     | .02   |
| $e_2$ | .9    | 0     | 1.0   | .1    | .2    |
| $e_3$ | .2    | 0     | .1    | 1.0   | .04   |
| $e_4$ | .05   | .02   | .2    | .04   | 1.0   |

FIG. 19

|       | $e_0$ | $e_1$ | $e_2$ | $e_3$ | $e_4$ |
|-------|-------|-------|-------|-------|-------|
| $e_0$ |       | .2    | .9    | .2    | .05   |
| $e_1$ |       |       | 0     | 0     | .02   |
| $e_2$ |       |       |       | .1    | .2    |
| $e_3$ |       |       |       |       | .04   |
| $e_4$ |       |       |       |       |       |

FIG. 20

$$\max(e_0 \cap e_1, e_0 \cap e_2, e_1 \cap e_2) = \max(.2, .9, 0) = .9$$

$$\max(e_0 \cap e_1, e_0 \cap e_3, e_1 \cap e_3) = \max(.2, .2, 0) = .2$$

$$\max(e_0 \cap e_1, e_0 \cap e_4, e_1 \cap e_4) = \max(.2, .05, .02) = .2$$

$$\max(e_1 \cap e_2, e_1 \cap e_3, e_2 \cap e_3) = \max(0, 0, .1) = .1$$

$$\max(e_1 \cap e_2, e_1 \cap e_4, e_2 \cap e_4) = \max(0, .02, .2) = .2$$

$$\max(e_2 \cap e_3, e_2 \cap e_4, e_3 \cap e_4) = \max(.1, .2, .04) = .2$$

FIG. 21

METHOD FOR CREATING CIRCUIT REDUNDANCY IN PROGRAMMABLE LOGIC DEVICES

FIELD OF THE INVENTION

This invention relates generally to programmable logic devices, and in particular to field programmable gate arrays (FPGA), either stand-alone FPGAs or "embedded" FPGAs (which include a non-configurable "hard-core" section and a dynamically reconfigurable "soft-core" section co-located on the same chip), in which the configurable logic blocks and the programmable routing structures are reconfigured dynamically and in which virtual redundancy is created for the purpose of fault tolerance of FPGAs.

In particular, the present invention relates to dynamically reconfigurable FPGAs where redundant circuits are created from structural elements of the FPGA unoccupied at a particular time period. In this fashion, a plurality of functionally identical duplicates of a primary circuit are created in a time multiplexing manner from structural elements of the unoccupied FPGA either by the primary circuit or by some duplicate circuits. For each application of the FPGA, the configured primary circuit and all duplicate circuits are interrogated by a voting circuit for detecting the presence of a fault, as well as for excluding a fault containing circuit (primary or any duplicate circuit) from operation.

Further, the present invention relates to a FPGA in which for fault tolerance thereof, no additional redundancy circuits need be added to the core structure of the FPGA, however, opposingly, the redundancy is created by dynamical reconfiguration of the structural elements of the FPGA in a time multiplexing manner. In this manner, identical circuits are formed, each in a respective time period, from unoccupied structural elements of the FPGA for further interrogation by a voting circuit for determining which of them is faulted and for excluding fault containing circuits from operation of the FPGA.

Also, the present invention relates to fault detection/diagnosis (isolation) in FPGAs by means of time multiplexing of a primary circuit and functional duplicates thereof configured from structural elements of FPGA in respective displaced time slots.

BACKGROUND OF THE INVENTION

Programmable logic devices include an array of configurable units, and by the nature of configuration of the configurable units for specific operation, may be divided into two groups, such as non-volatile and volatile programmable logic devices. The non-volatile programmable logic devices, in order to achieve a specific configuration of configurable units, require well-known "burn-in" techniques, and for this purpose they employ fusible links. Typically, these devices may only be configured once and do not allow for reconfiguration in different applications.

The volatile programmable logic devices, such as field programmable gate arrays (referred herein to as FPGAs), have found wide applicability due to the flexibility provided by their reprogrammable nature. Typically, as shown in FIG. 1, FPGA 10 has two internal chip layers, such as a foundation layer 12 where a static random access memory (SRAM) is created, and an upper layer 14 in which required circuitry is formed to perform desired logic functions. The upper layer 14 includes an array of configurable logic units that are programmably interconnected each to the other where each configurable logic unit may also be individually reprogrammed to perform a number of different logic functions. The upper layer 14 also includes a configurable routing structure for interconnecting the configurable logic units in accordance with the intended circuit application. The foundation layer 12 includes a plurality of configuration memory cells which are accessible through the application configuration port 16 through which an address of a memory cell to be accessed is input, and through which data exchange with the aimed memory cell is carried out. Since each bit of the static random access memory (SRAM) of the foundation layer 12 includes a flip-flop for recording a logical "1" or logical "0", which may be set or reset an infinite number of times, on "power down" of the FPGA 10, the state of the flip-flop is typically lost, thereby making the FPGA volatile.

The configuration memory cells of the SRAM are coupled to the upper layer 14 through the configuration data channel 18 to specify the function to be performed by each configurable logic unit as well as to specify the configurable routing structure between the logic units. Once a specific configurable circuit is formed in the upper layer 14 it is fed with user input data 20 to obtain user output data 22 at the output of the FPGA 10.

As shown in FIG. 2, the SRAM in the foundation layer 12 is divided into three basic portions, (1) the logic unit configuration portion 24 which is devoted for programming the configurable logic units in the upper layer 14; (2) the VIA configuration (interconnection) portion 26 which determines the routing structure of the FPGA; and, (3) the user flip-flops, latches, and memory portion 28 which includes data storage memory cells accessible by a user during operation of the FPGA. The VIA interconnections of the FPGA are controlled by a large number of multiplexers in the upper layer 14.

Although the FPGA 10 shown in FIGS. 1 and 2 have found wide applicability, they have drawbacks, which include relatively slow speed of reconfiguration (on the order of milliseconds) that has been found to be non-satisfactory for carrying out dynamic reconfiguration techniques, also known as "configuration on the fly", which allows the promising concept of configuring a FPGA in stages in order to propagate a specific calculation. For example, in the prior art, if a Fast Fourier Transform is to be computed, and the entire Fast Fourier Transform network cannot be fit into an FPGA chip, the Fast Fourier Transform is partitioned into stages. Then, each stage of the Fast Fourier Transform is configured into the FPGA in a time sequence, and the results from stage to stage are stored in common memory or buffer. The results of a previous stage serve as input to a next page; and this process is repeated for all of the required stages of the Fast Fourier Transform. It will be clear to those skilled in the art that for such a dynamic configuration of the FPGA, a configuration time in a microsecond range would be highly advantageous.

Such dynamically reconfigurable FPGAs capable of being reconfigured within microseconds or less, have been developed by companies Xilinx, Inc., and Altera Corporation. For example, U.S. Pat. Nos. 5,978,260 and 6,105,105 describe FPGAs in which the complete configuration of FPGAs may be accomplished in less than one microsecond. These advanced FPGAs support dynamic configuration and time multiplexing by employing memory slices, as shown in FIG. 3. Each memory slice 30, 32 and 34 contains a complete configuration of the FPGA 10 for a specific function to be performed. By rapidly switching between different memory slices 30, 32 and 34 through supply of "Select Slice" data 36, the array of the configurable logic units in the upper layer 14 may be reconfigured from one application to another in a time multiplexing fashion. In the dynamically reconfigurable FPGAs shown in FIG. 3, the "logic unit configuration" portion 38, "VIA configuration" portion 40 and "user flip-flops, latching and memory" portion 42 carry data in several channels, each corresponding to an active memory slice 30, 32 or 34.

Among numbers of applications thereof, FPGAs have found their use in aerospace applications where they are subject to radiation and cosmic particles. All semiconductor chips, including FPGAs, aboard a craft are vulnerable since the adverse space environment potentially causes intermittent faults, a.k.a. "Single Event Upset", and permanent faults. Radiation and cosmic particles from space tend to inject electronic charge into the FPGA circuitry which may change the state of bistable elements or may cause an unwanted impulse on a gate. These faults are considered Single Event Upsets and represent the majority of radiation faults. These faults may upset the circuitry but may not permanently damage hardware. On occasion, the charge is large enough to cause microheating. In this case, a permanent short or open circuit may occur.

Since the semiconductor chips aboard spacecraft are vulnerable, chips may be radiation hardened through special processing techniques, such as silicon-on-insulator. However, this technique does not completely eliminate the problem. For this reason, the redundancy is built into mission critical electronics systems as a means of further enhancing the tolerance thereof.

Fault free performance of programmable logic devices is of essence not only in aero-space, but also in terrestrial applications. For example, there exist faults common to commercial FPGAs which include metal migration faults, manufacturing faults, and faults from electrical static discharge.

Metal migration tends to cause short circuits and sometimes open circuits. It is a function of the temperature and the type of metals used in a chip, and may occur as the result of the chip exposition to excessive temperature over an extended period of time. Migration also occurs as the chip ages.

Manufacturing faults are caused by a variety of reasons, including poor grade of materials, contamination from dust particles and poor handling, etc. Although, for the most part, these faults are detected at a manufacturing facility, some of them escape screening tests.

Electric static discharge occurs when chips are mishandled by either people or machines. If this occurs, the static discharge into chip leads causes micro-heating which may damage internal conducting traces.

In general, a primary, and at least one duplicate copy, is needed for fault detection. Disagreement found in performance of the primary and duplicate circuits may manifest the presence of a fault in one of the circuits. However, it is generally impossible to judge which one of the circuits has faulted. For fault diagnosis and fault isolation, therefore, the primary and at least two duplicate circuits are needed. In this scenario, the performance of all three circuits are compared and if one of them differs it is rejected as the faulted circuit. Similarly, the primary and at least two duplicate circuits are needed for redundancy. Voting circuits interrogate all redundant circuits and the one showing a different performance is removed from operation according to a "majority principle" known to those skilled in the art.

When sufficient resources are available, complete physical redundant units is the preferred means of obtaining fault tolerance. It is not uncommon to have triple or even quadruple redundancy of certain critical system elements, such as, for example, the CPU. Disadvantageously, physical redundancy is costly, and the volume, weight, power and heating constraints are all multiplied by the need for such redundancy. A typical redundancy is particularly costly in spacecraft design. Therefore, designers are selective in choosing which components require redundancy.

In those exceptional cases, when there are no costs, volume, weight, power, or thermal constraints, addition of independent duplicate FPGA chips is the preferred means of achieving redundancy. Additionally, a special chip is provided for majority voting between identical FPGA chips.

When multiple FPGA chips are not a practical alternative, in view of the above listed constraints, then a single large capacity FPGA chip is often utilized. Such a mega FPGA chip includes the Xilinx Virtex series and the Altera Apex series, which are being used for system chip design. Disadvantageously it is often not possible or extremely difficult to fit complete circuit duplicates within a single mega FPGA since even the mega FPGAs do not have sufficient resources to support complete multiple duplicates. Further, in practical design, the resources of the FPGA often fall short by a small percentage in meeting duplicate area requirements. For example, for triple redundancy, where 200% overhead is needed, the overhead may be 180% or 190%. It is clear therefore that redundancy in FPGAs created by separate FPGA chips or on one mega FPGA chip has extreme drawbacks.

Presently, NASA is developing FPGA applications for space. To help with radiation fault problems, the configuration of the FPGA is constantly read back as the FPGA is being used. This reading does not interfere with normal operation of the FPGA and will detect problems in the SRAM portion 12 of the FPGA which is generally the most sensitive area. The method does not, however, cover "faults" in the circuit section 14 of the FPGA. Additionally, this method is strictly a fault detection scheme and not a fault redundancy technique.

It is therefore highly desirable to provide a fault redundancy technique for FPGAs which would avoid physical addition of redundant circuits thus minimizing cost, volume, weight, power, and/or thermal issues associated therewith.

SUMMARY OF THE INVENTION

It is an object of the present invention to provide a fault redundancy method for FPGAs which does not require physical addition of duplicate circuits.

It is another object of the present invention to provide a fault redundancy technique in dynamically reconfigurable FPGAs in accordance with which a plurality of duplicate circuits are configured on an FPGA in time multiplexing fashion from unoccupied structural elements of the FPGA.

It is still a further object of the present invention to provide dynamically reconfigurable FPGA with means for identifying unoccupied structural elements of FPGAs for further forming duplicate circuits in a time-multiplexing fashion.

An additional object of the present invention to provide a method for creating virtual circuit redundancy in FPGAs by (a) configuring, at a first time slice, a first portion of the structural elements of the FPGA into a primary circuit for a predetermined application, (b) identifying a second portion of the structural elements having the least overlap (preferably close to zero overlap) with the structural elements of the first portion, (c) configuring, at a second time slice, these zero overlap structural element of the second portion into a first duplicate circuit functionally identical to the primary circuit, (d) identifying a third portion of the plurality of structural elements having the least overlap with the structural elements involved into the primary circuit and into the first duplicate circuit, (e) configuring the third portion of the structural element into a second duplicate circuit in a third time slice, (f) repeating the steps (b)–(e) until a required number of duplicate circuits has been created in time multiplexing fashion, and (g) comparing performance of the primary circuit and all created duplicate circuits to judge which of those circuits is fault containing in order to exclude this circuit from the operation of the FPGA.

Another object of the present invention is to provide a fault tolerance technique for existing dynamically reconfigurable FPGAs by creating duplicate circuits from the elements of the FPGAs unoccupied by any other primary or duplicate circuit for further interrogation thereof by a voting circuitry and by providing in these FPGAs means for identifying, at each time slice, the unused FPGA resources.

The present invention may find its utility in numerous fields of application where fault tolerance is required, and particularly, in aerospace applications where semiconductor FPGAs are subject to radiation and cosmic particles, as well as in commercial applications where semiconductor FPGAs may suffer from metal migration, manufacturing shortcomings, and from poor handling.

The present invention is also applicable to different types of FPGAs, including particularly, so-called "embedded" chips which have non-configurable "hard-core" section and dynamically reconfigurable "soft-core" section co-located on the same chip.

In accordance with the teachings of the present invention, a method for creating virtual redundancy in FPGAs is provided in accordance with which, at a first time slice, a primary group of a plurality of structural elements of the FPGAs are configured into a primary circuit for a predetermined application of the FPGA, with sequential time slices following the first time slice being defined.

In each of the following time slices, a respective duplicate group of the plurality of structural elements of the FPGA is identified which have the least spatial overlap (preferably, zero overlap) with the primary group and with any of other duplicate groups. Then, each duplicate group is configured into a duplicate circuit functionally identical to the primary circuit so that performance of the primary circuit and of the duplicate circuits may be compared in time multiplexing fashion for determining which of the circuits is faulted for further excluding the faulted circuit from the operation of the FPGA.

The structural elements of the FPGA may include configurable logic units, interconnections formed on the FPGA chip, structural elements within each logical unit, and I/O units of the FPGA.

Preferably, when identifying the unoccupied structural elements, the search is performed for (a) unoccupied configurable logic units, and further, upon exhaustion thereof, for (b) unoccupied structural elements within occupied configurable logic units.

Duplicate circuits may be arranged in different mutual spatial relationship with respect to a primary circuit, and to duplicate circuits created in other time slices. For example, a duplicate circuit may be linearly displaced from other circuits created in other time slices; or the duplicate circuit can be disposed in rotational mutual disposition with regard to other circuits created in other time slices. A requirement is that the spatial overlap between the structural elements of redundant circuits will have the least spatial overlap, preferably zero overlap in order to eliminate possible confusion in detecting which of the circuits contains a fault.

The spatial displacing of the duplicate circuits with respect to the primary circuit enhances the ability to detect and isolate a fault due to a fault multiplication effect associated with use of a given faulted structural element in different circuits, which are likely to generate different responses to the same given faulted structure.

The method of the present invention is particularly applicable to dynamically configurable FPGAs (stand-alone chips or "embedded" FPGAs) in which multiple memory slices are used, each of which includes the whole configuration of the FPGA for a certain time period. In this manner, when one of the memory slices is actuated for creating a primary circuit for a predetermined application, all above discussed operations of creation of virtual redundancy are carried out in order to detect and exclude a faulted structural element from the operation.

After the entire cycle for the predetermined application is completed, the logic moves to another memory slice to create a primary circuit for another application and for creating the associated virtual redundancy. Thus, in each memory slice, a primary circuit for a specific application is created, then duplicate circuits for the primary circuit for the specific application are created in time multiplexing fashion. The voting unit interrogates the primary circuit and duplicate circuits with the purpose of excluding a fault containing circuit from operation.

Another aspect of the present invention is a FPGA having:
a plurality of configurable structural elements (which are configurable logic units, elements within configurable logic units, routing structure, and I/O units),
means for defining a plurality of time slices for each of distinct applications of the FPGA,
configuration means containing configuration data coupled to the configuration structural element to, first, configure a primary group thereof into a primary circuit in a $1^{st}$ time slice, and, second, in a $(1+i)^{th}$ time slice to configure a duplicate group of the configurable structural element into an $i^{th}$ duplicate circuit functionally identical to the primary circuit, wherein i=1,2, . . .

The FPGA further includes means for selecting in each of the $(1+i)^{th}$ time slice the $i^{th}$ duplicate group of the configurable structural elements having the least overlap with structural elements occupied during $1^{st}$ through $i^{th}$ time slices, and
a voting circuit for interrogating the primary circuit and the duplicate circuits in time multiplexing fashion for comparing performance thereof for further judging which circuit includes a fault or excluding the fault containing circuit from the operation of the FPGA.

Prior to selecting of the next group of the configurable structural elements, the identification of non-overlapping structural elements is performed, preferably, off-line on a computer work station. Once suitable structural elements are found, they are applied to the FPGA.

These and other novel features and advantages of this invention will be fully understood from the following detailed description of the accompanying Drawings.

BRIEF DESCRIPTION OF THE DRAWINGS

FIG. 19 shows a matrix used for exhaustive search for orthogonal equivalents in accordance with the present invention;

FIG. 20 is a reduced matrix for exhaustive search for orthogonal equivalents in accordance with the method of the present invention; and FIG. 21 shows the principles of exhaustive search for orthogonal equivalents from FIG. 20 using the max-min principle.

DETAILED DESCRIPTION OF THE PREFERRED EMBODIMENT

Figure 1:
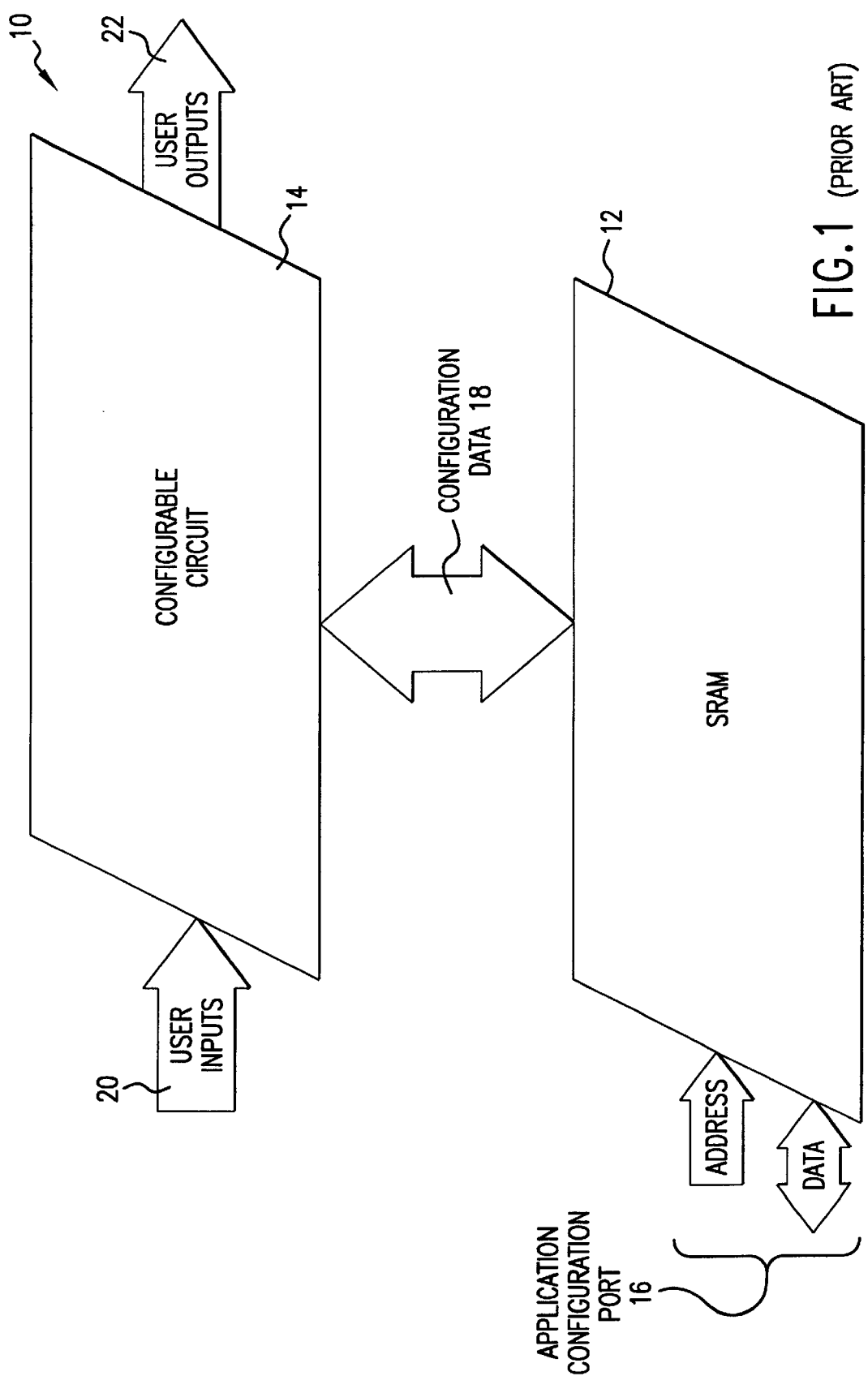
FIG. 1 is a schematic representation of a conventional FPGA.
Figure 2:
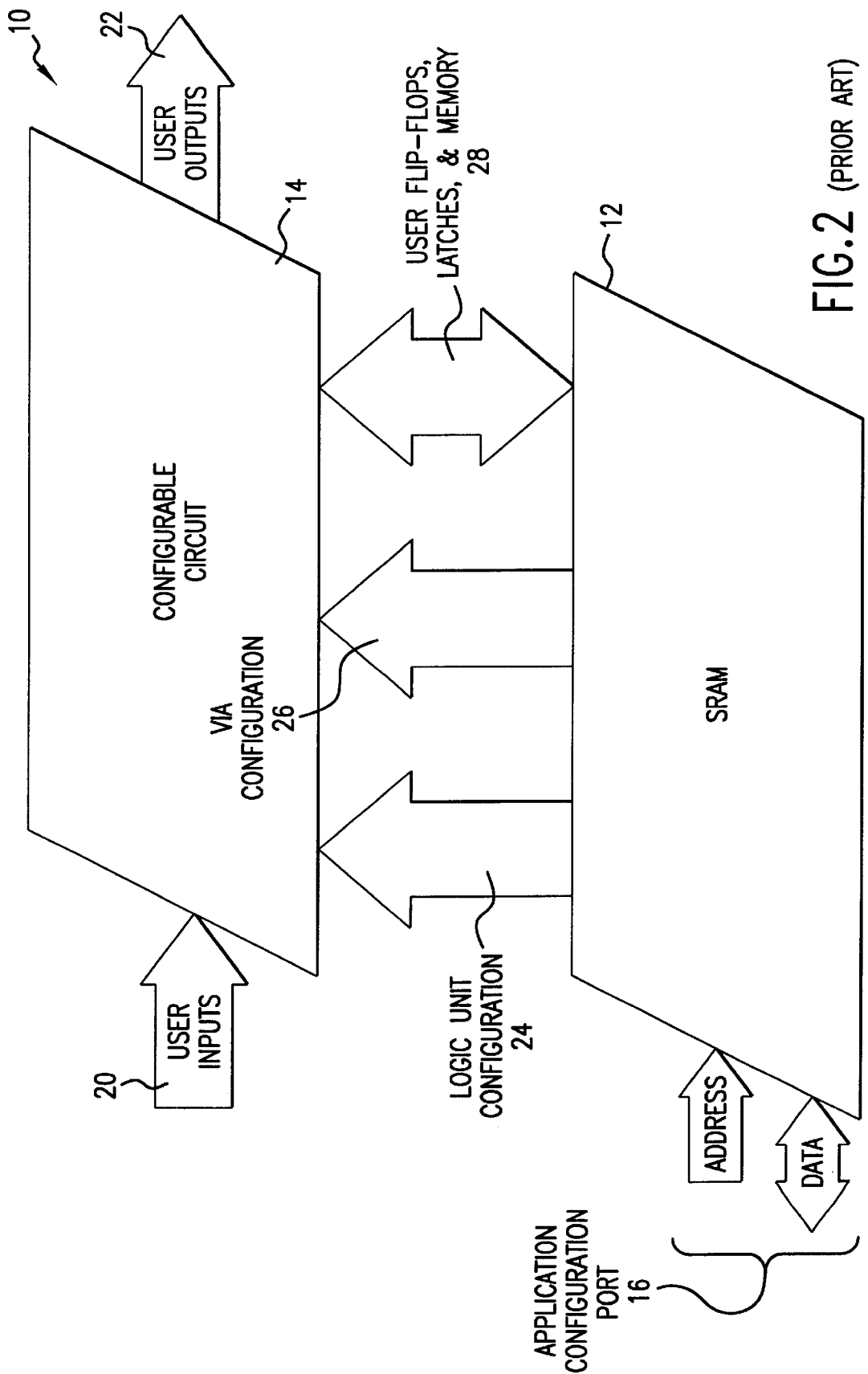
FIG. 2 is a more detailed schematic representation of a conventional FPGA.
Figure 3:
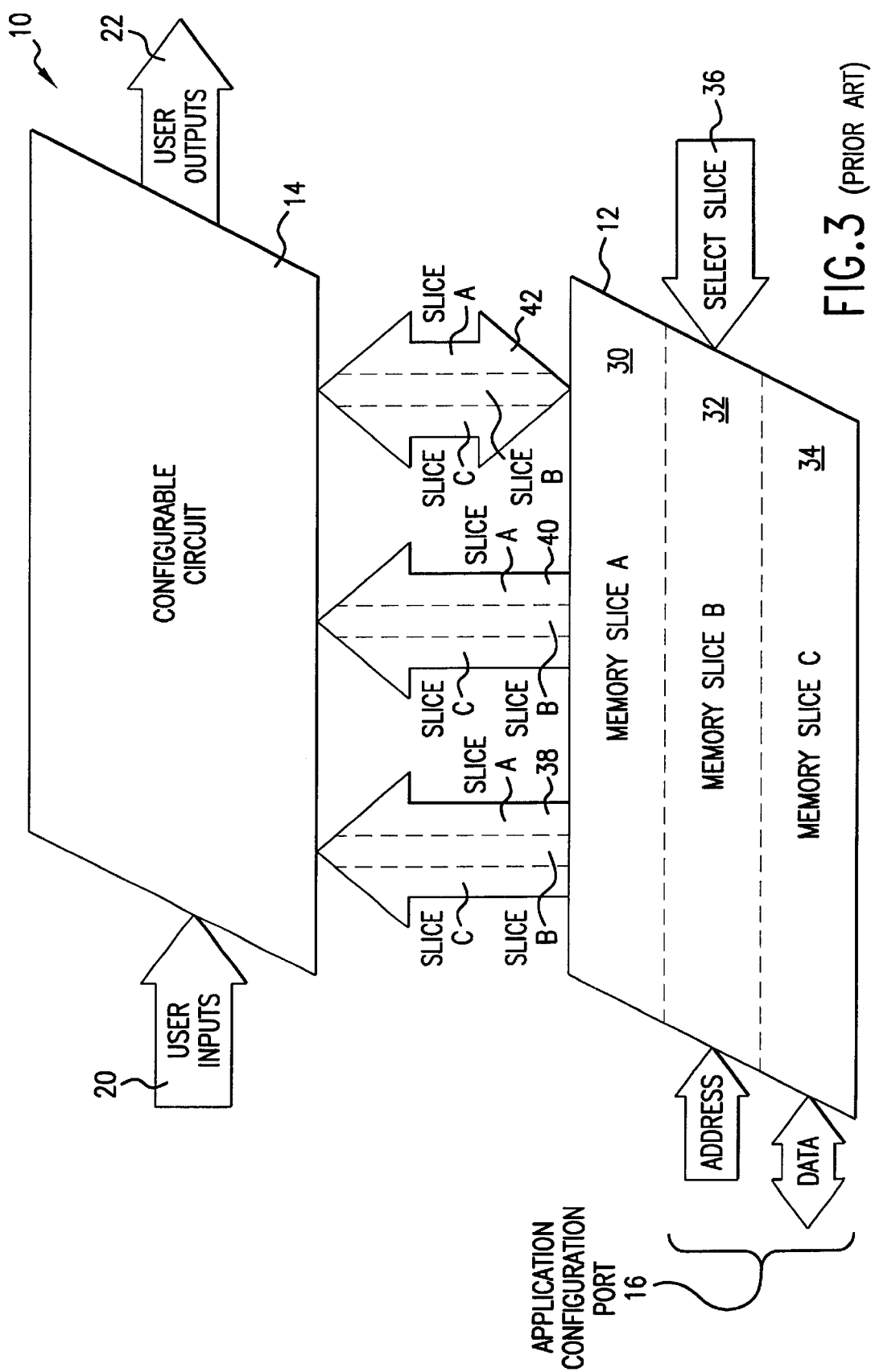
FIG. 3 is a schematic representation of a dynamically configurable FPGA of the prior art with time multiplexing feature.
Figure 4:
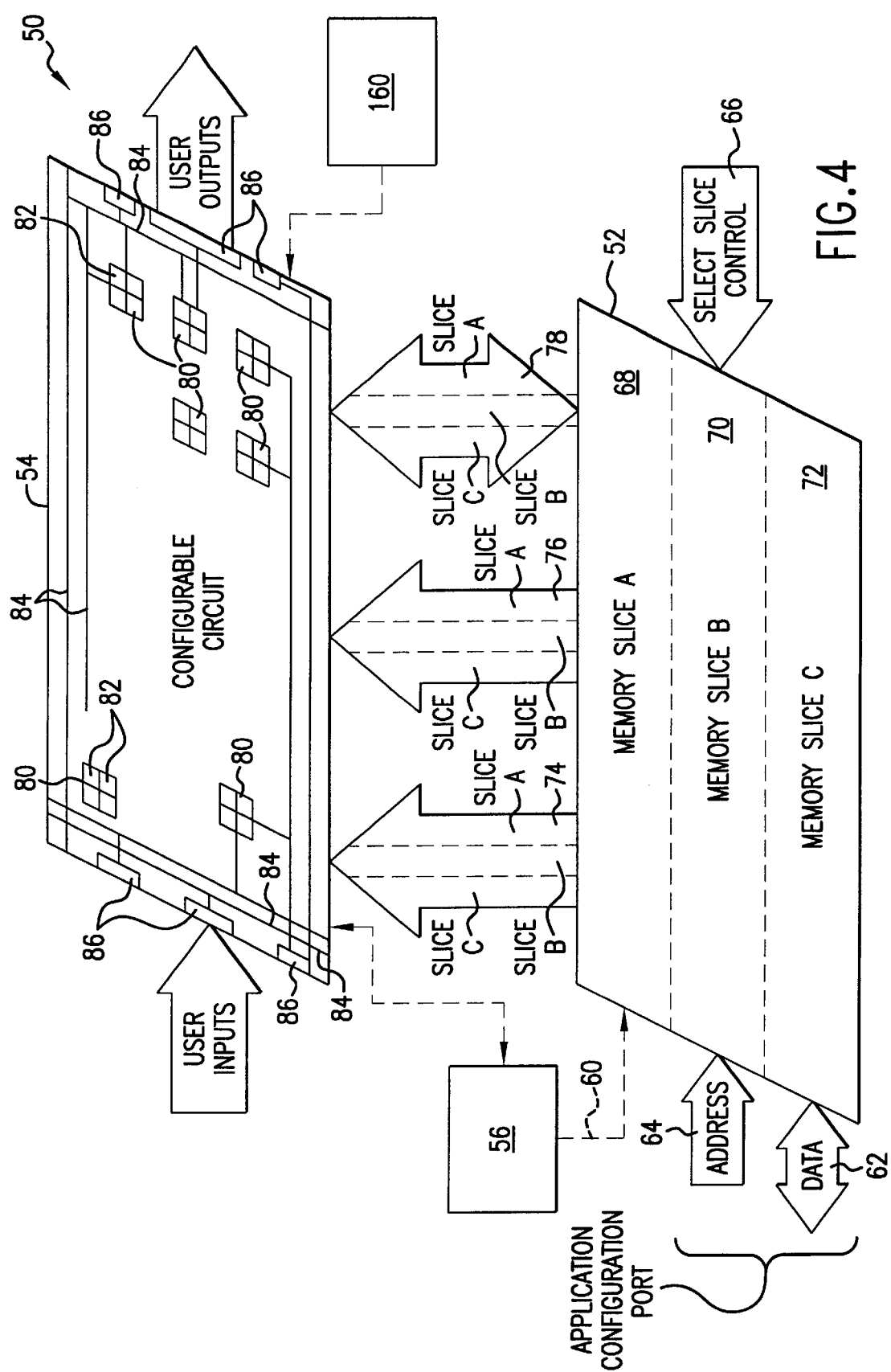
FIG. 4 is a schematic representation of the FPGA of the present invention.

Referring to FIG. 4, an FPGA 50 of the present invention includes a memory layer 52, and a configurable circuit layer 54. An off-line computer development workstation 56 is operatively coupled to the configurable circuit layer 54 for identifying unused resources on the configurable circuit layer 54, in order that the unused resources on the configurable circuit layer 54 may be arranged into a duplicate circuit, as will be described in detail in following paragraphs.

The memory layer 52 includes a plurality of memory slices, which in this example provides memory slice 68, memory slice 70, and memory slice 72. It should be understood, however, that any number of memory slices may be contained in the memory layer 52. The memory layer 52 includes a plurality of memory cells each of which is accessible by data 62 supplied to a memory cell directed by the address data 64. A particular memory slice is selected in accordance with "Select Slice" Control 66 supplied to the memory layer 52 in accordance with a required function to be performed by the FPGA 50. Each memory slice 68, 70, and 72 is coupled to the configurable circuit layer 54 through the "logic unit configuration" channel 74, VIA configuration channel 76 and "user flip-flops, latches, and memory" channel 78 for dynamic reconfiguration of the configurable circuit 54 in accordance with a required function to be performed by the FPGA 50. The circuit layer 54 carries a plurality of configurable logic units 80 each of which includes elements 82 therewithin, routing structure (or interconnections) 84, and I/O units 86.

In accordance with the present invention, at a particular memory slice, for example memory slice 68, the configurable circuit layer 54, particularly the logic units 80, structural elements 82 within each logic unit 80, interconnections 84 and I/O units 86 are configured through the channels 74, 76 and 78 to create a specific primary circuit.

Figure 5:
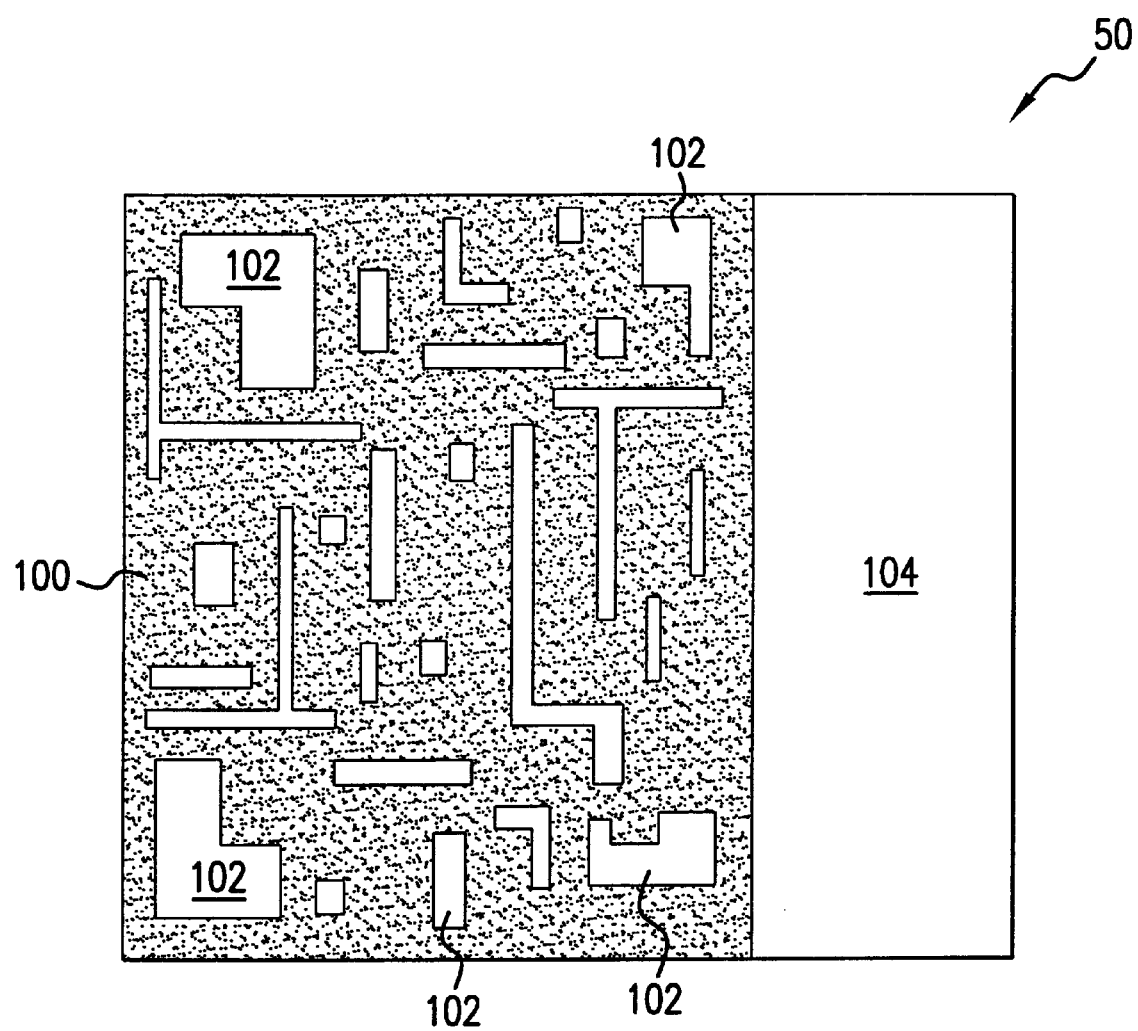
FIG. 5 is a schematic representation of an FPGA showing unused resources which can be used for creation of duplicate circuits in time multiplexing fashion in accordance with the present invention.

When the primary circuit is configured, in time slice 1 for function A, there is a significant portion of unused structural elements. For example, when a configurable logic unit 80 aboard the FPGA 50 is configured to support a simple AND gate, the structural elements such as transistors intended for more complicated functions are not used. Additionally, flip-flops in the configurable logic unit 80 are also not used. The same holds true with FPGA's routing structure. For a given design, the number of unused hardware elements is typically greater than those structural elements in use. Unfortunately, the unused structural elements are scattered throughout the FPGA and it is difficult to exploit them. This is one of the benefits of the method of the present invention in that it exploits fragmented resources of the FPGA. For example, as shown in FIG. 5, at a respective memory slice, the FPGA 50 utilizes resources positioned in area 100. The areas 102 and 104 contain resources unoccupied by the resources 100. The resources 102 are hidden in fragmented areas which are scattered throughout the configuration. The area 104 represents unfragmented area resulting from a mismatch existing between the FPGA fixed chip size and the actual needed size for a specific application (which may vary from application to application).

Figure 6:
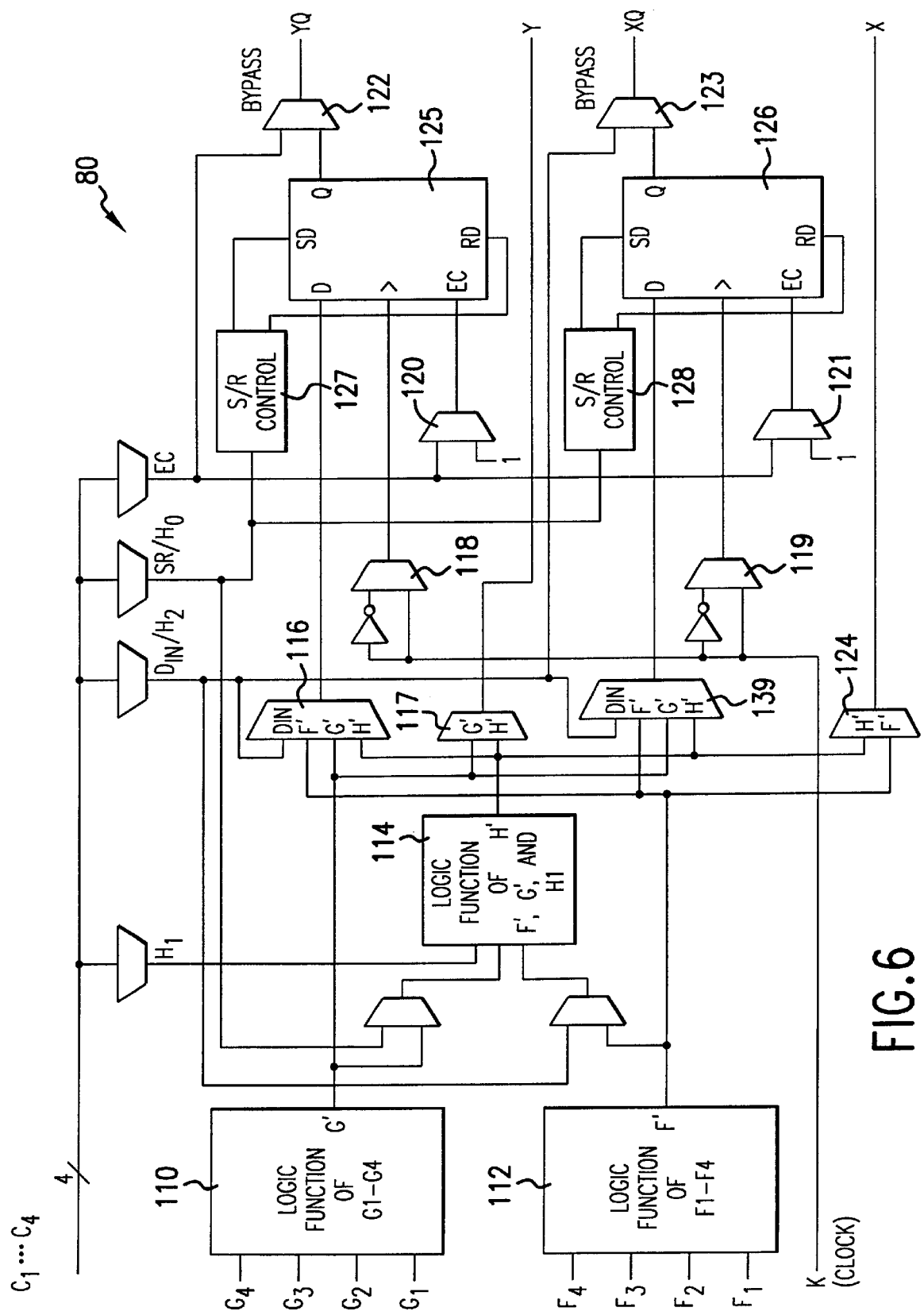
FIGS. 6–9 are electrical block diagrams of a configurable logic unit of a FPGA showing unused and hidden resources within FPGA unoccupied during forming of primary circuits for different applications.
Figure 7:
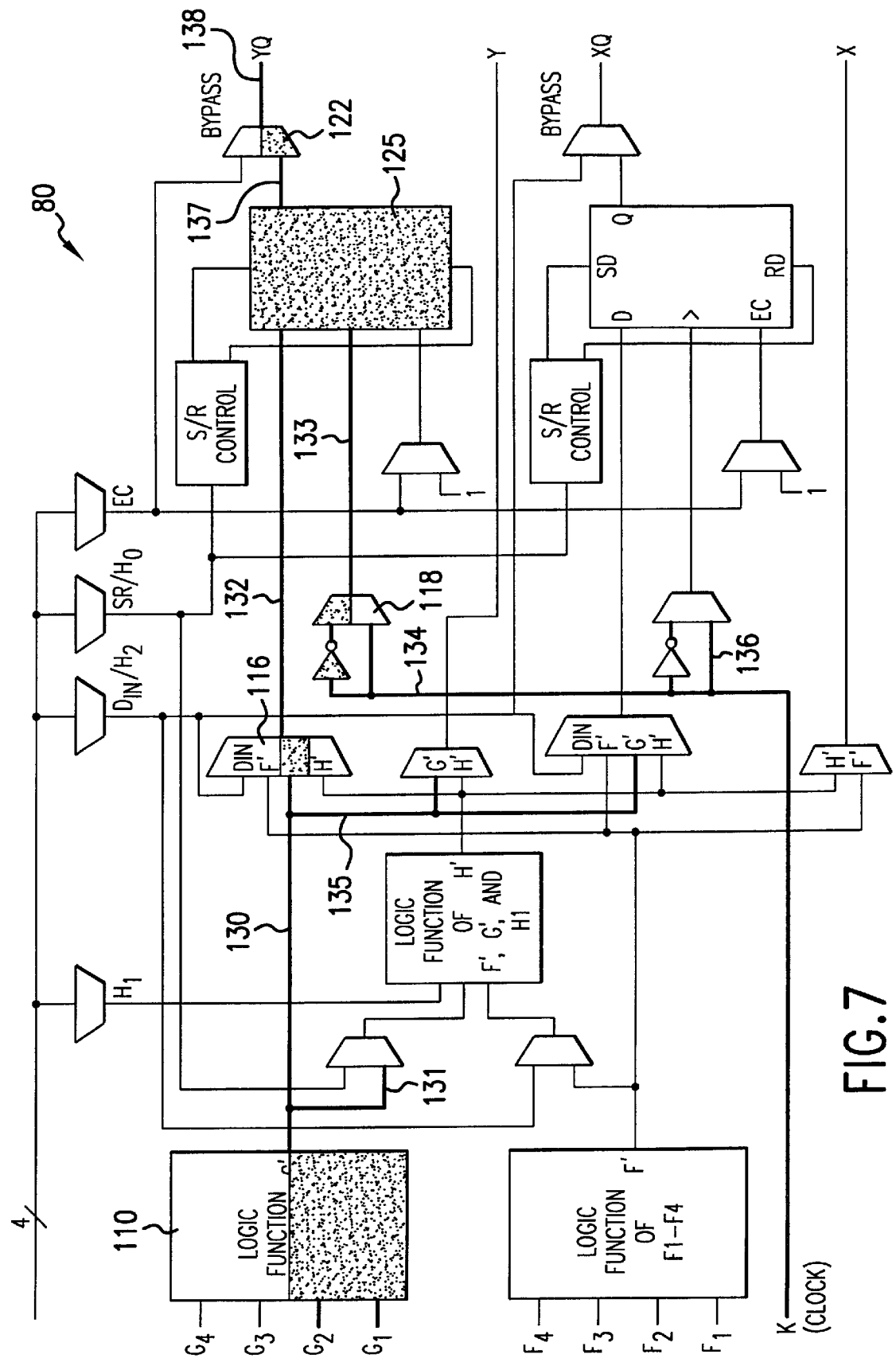
Figure 8:
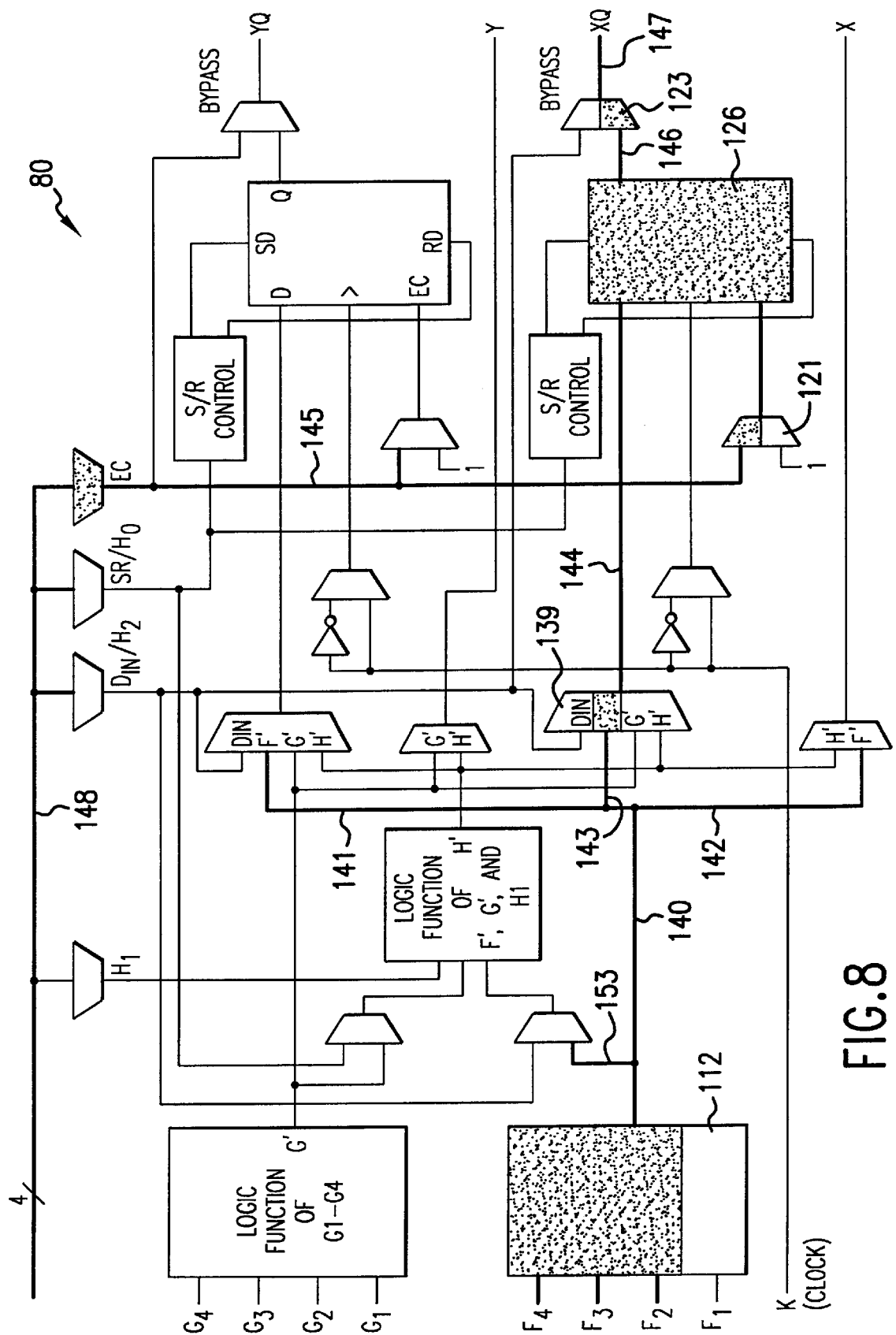

One of the configurable logic units 80, for example, of the Xilinx 4000 series of the FPGA 50 is shown in FIG. 6. In this embodiment, the configurable logic unit 80 includes logic function generators 110, 112, and 114, and a plurality of multiplexers 116–124 and 139. The configurable logic unit 80 further includes flip-flops 125 and 126 and S/R control units 127 and 128. During operation, the data contained, for example, in memory slice A, are read out to update the configuration logic unit 80 and the routing structure 84 on the chip, thereby causing the configurable logic units to perform a specific logic function. For example, as shown in FIG. 7, the configurable logic unit 80 is configured as an unlatched two input exclusive OR gate, which is representative of a structure corresponding to the memory slice A. It is clearly seen that only a portion of the resources of the configurable logic 80 are used, such as a portion of the logic function generator 110, portion of multiplexers 116 and 118, the flip-flop 125 and portion of the multiplexer 122, as well as connections 130–138. Generally, less than 50% of the configurable logic unit 80 parts are really used. Referring now to FIG. 8, representing the logic unit 80 configured in accordance with the data contained in the memory slice B, the configurable logic unit 80 is reconfigured to perform as a non-latched 3-input AND gate wherein only the portion of the logic function generator 112, portions of the multiplexers 139, 121, and 123, and the flip-flop 126 are occupied as well as interconnections 140–148. From this it is seen that only a small portion of the configurable logic unit's parts are occupied for performing the function specified in the memory slice B.

Figure 9:
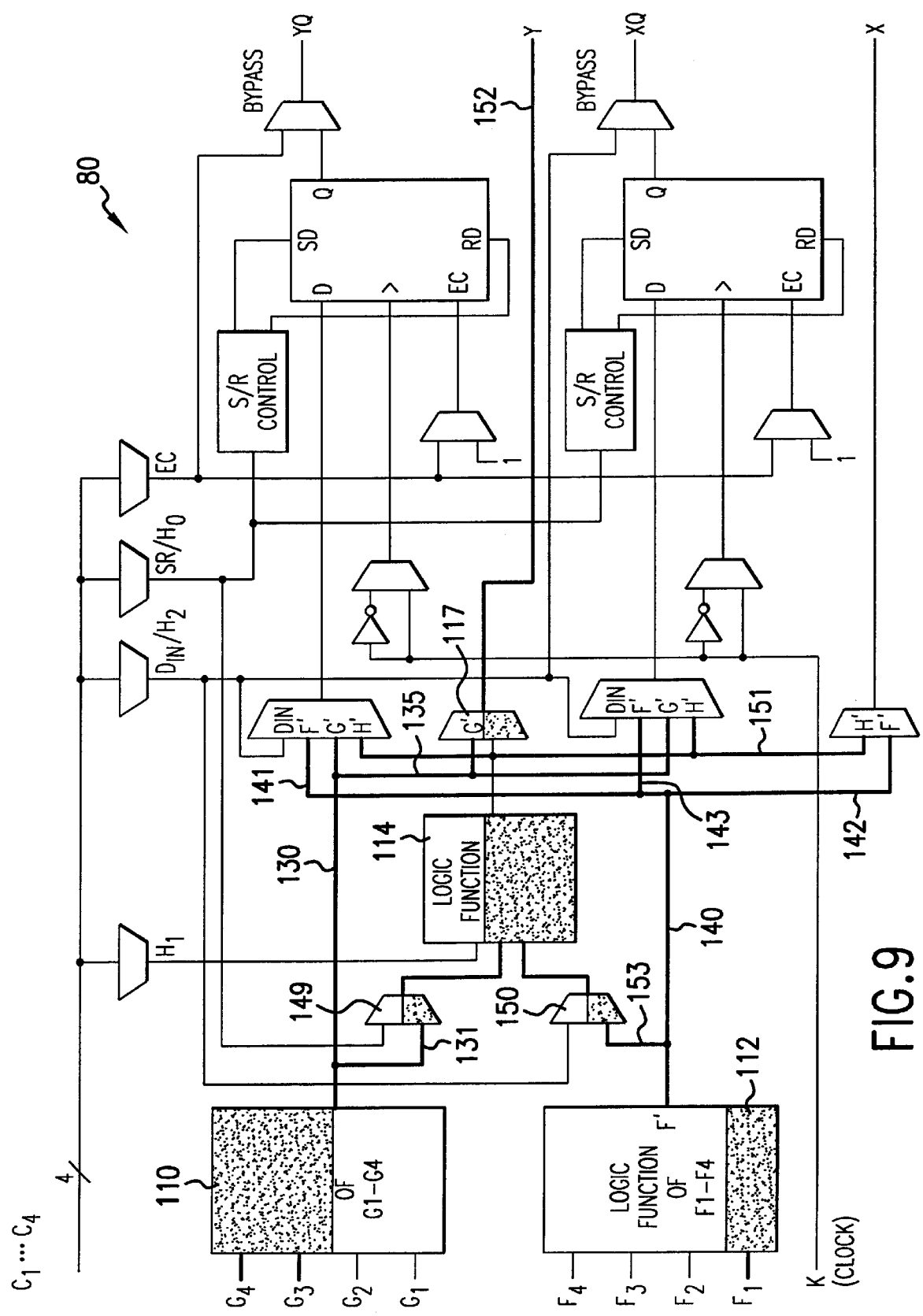

Referring to FIG. 9, in accordance with the structure specified by the memory slice C, a non-latched 3-bit parity gate is implemented in the logic unit 80. The reconfiguration is carried out by invoking a portion of logic function generators 110, 112, and 114, a portion of multiplexers 149, 150, and 117, as well as connections 130, 131, and 135 common with the circuit of FIG. 7, interconnections 140, 141, 142, 143, and 153, common with the circuit of FIG. 8, and interconnections 151 and 152. There is no overlap hardware between memory slice A and memory slice B. Therefore, memory slice A and memory slice B are totally independent copies at least for these particular configurable logic units 80.

Figure 10:
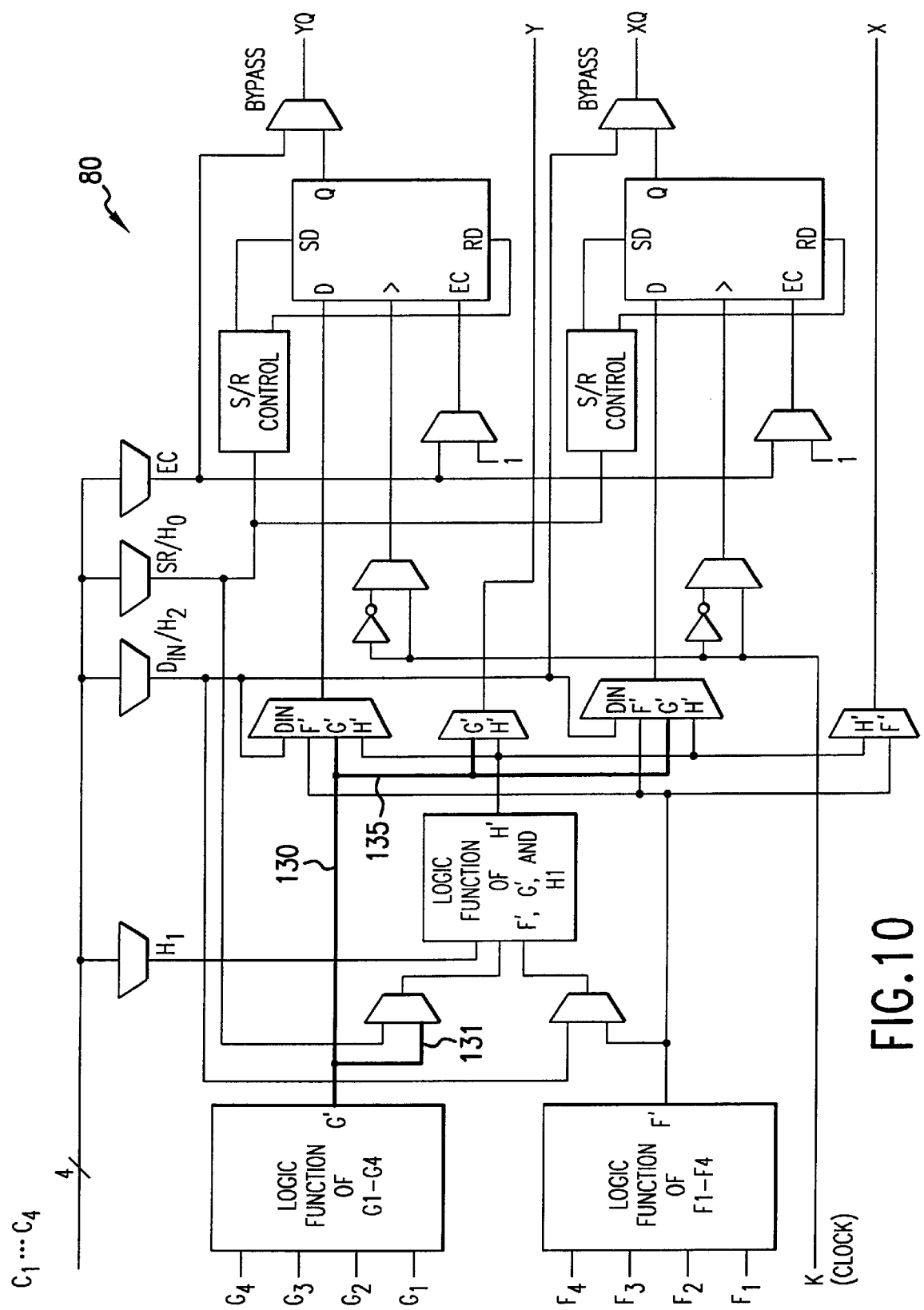
FIGS. 10 and 11 show intersections between elements of the primary circuits of FIGS. 6–9.
Figure 11:
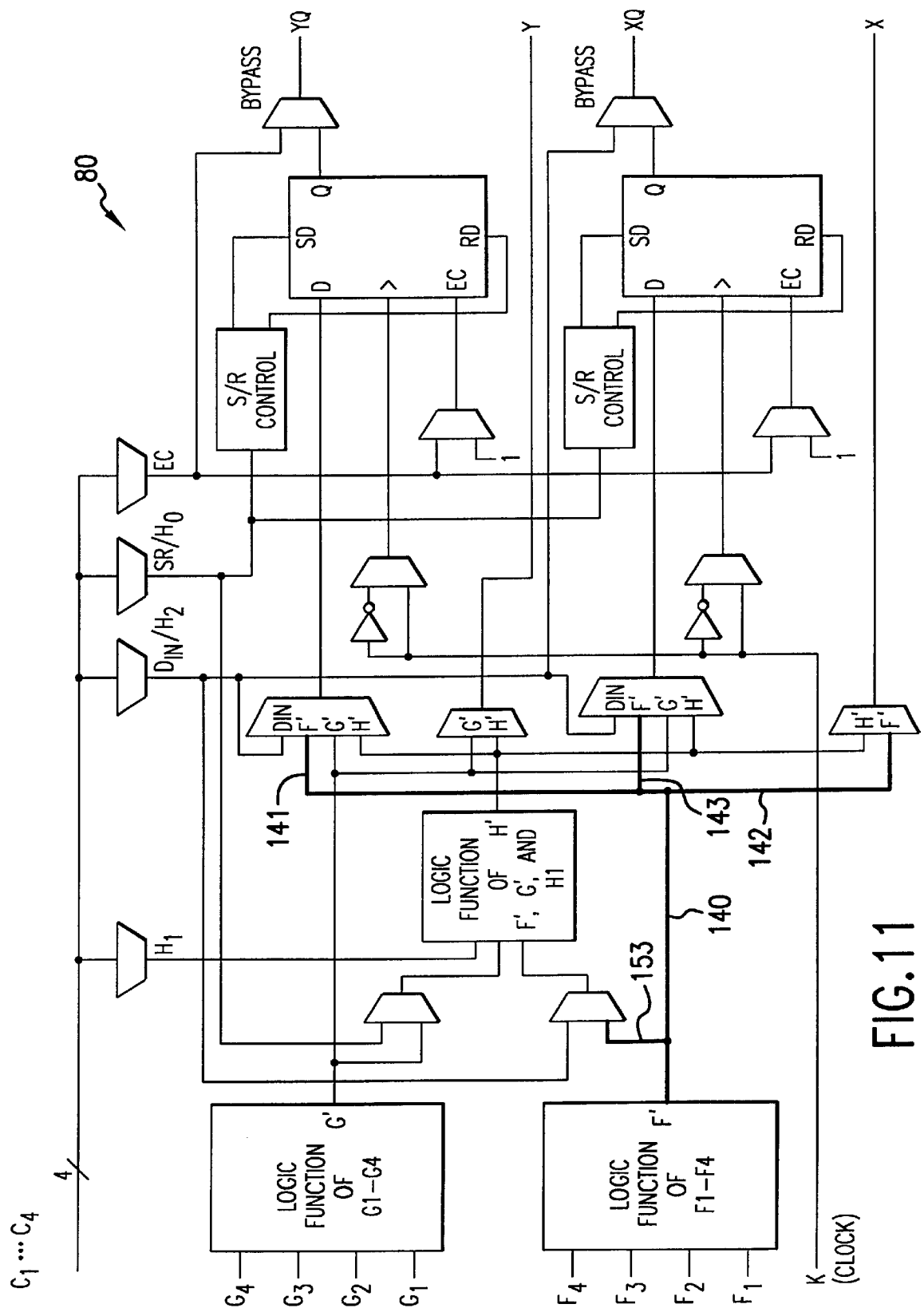

FIG. 10 shows elements common for memory slice A and memory slice C which include interconnections 131, 130 and 135. FIG. 11 shows elements common for memory slices B and C, which include interconnections 140, 141, 142, 143, and 153. Only a portion of core elements of the configurable logic unit 80 is used in each specific application, and a small portion of the structural elements of the configurable logic unit 80 are common to all of the circuits shown in FIGS. 7–9. Unfortunately, the configurable logic unit design in this example does not allow for completely independent circuit, as shown in FIGS. 10 and 11 where memory slices B and C, as well as memory slices A and C, have common sections.

Figure 13:
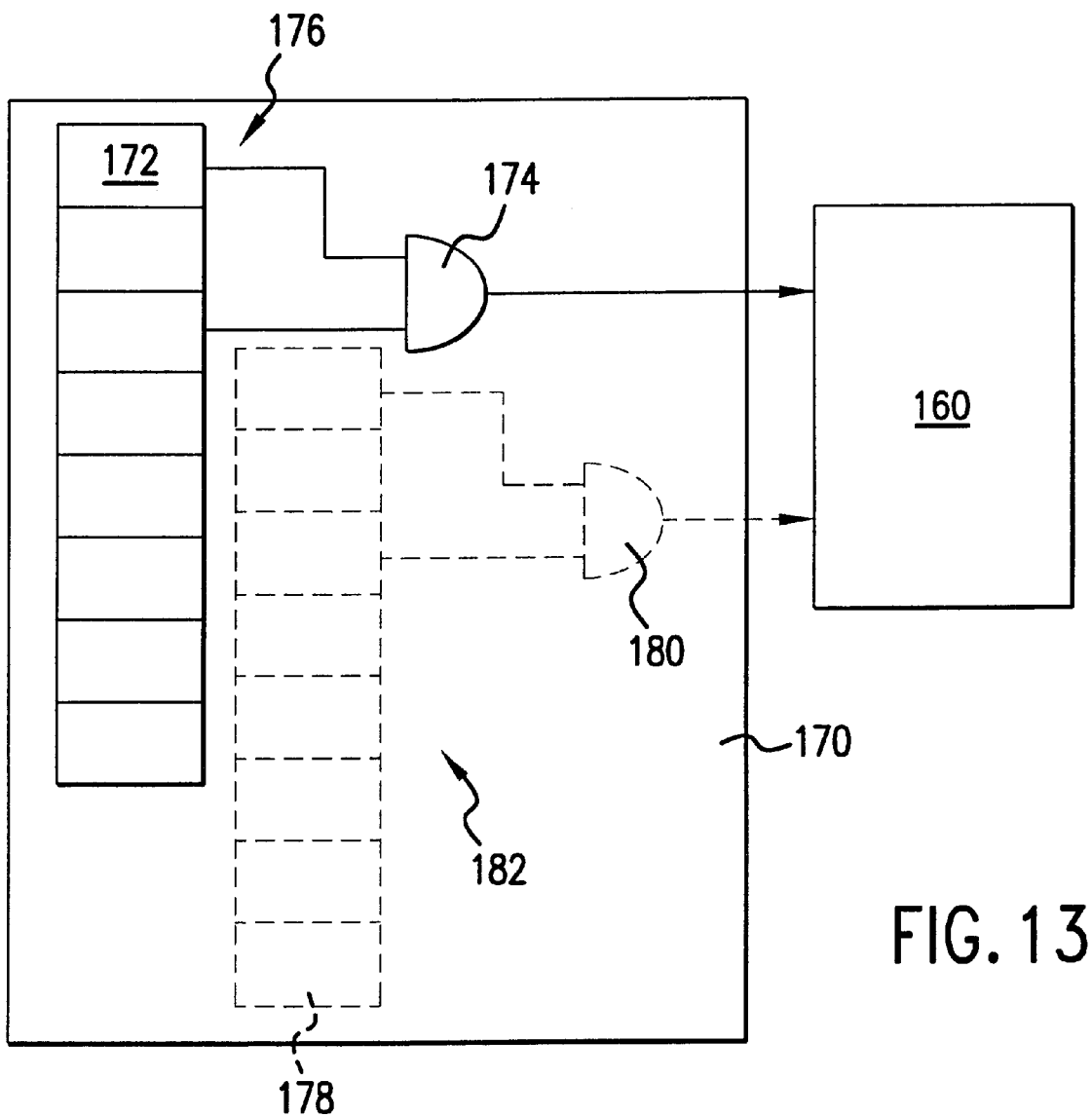
FIG. 13 is a schematic representation of a linearly displacement principle of the present invention.

The basic principle of the present invention is to employ the unoccupied resources of the FPGA for creating therefrom, in time-multiplexing fashion, duplicate circuits, so that a voting unit 160, best shown in FIGS. 4 and 13, may compare performance of the redundant circuits for detecting the presence of a fault and for determining which circuit contains the fault in order to exclude the faulted circuit from operation of the FPGA 50.

Figure 12:
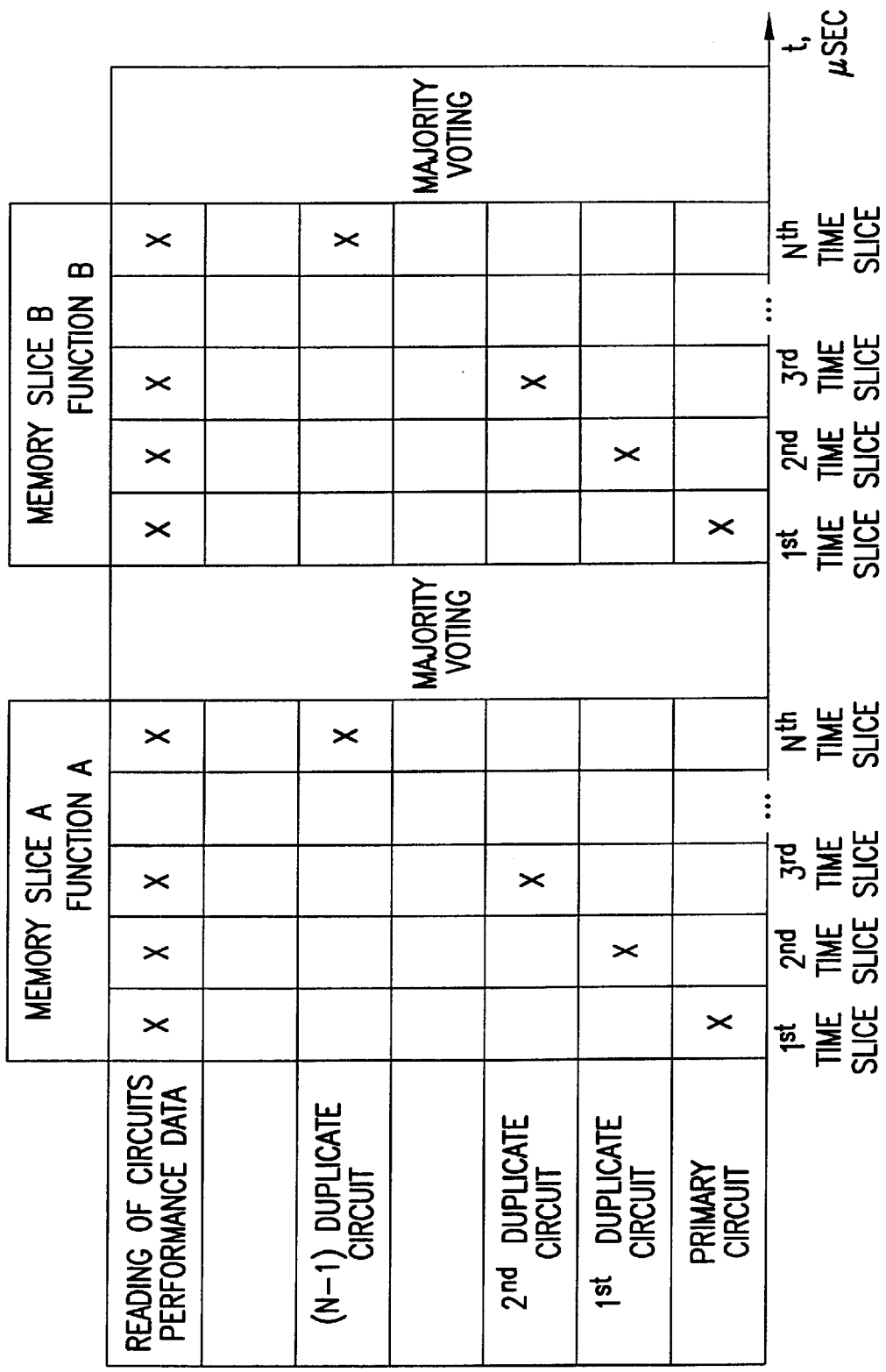
FIG. 12 is a time diagram of a method of the present invention.

The technique of the present invention is presented in time depending manner in FIG. 12, where reconfigurations events and majority voting steps are plotted vs. time. When a memory slice A is activated to specify a function A to be performed by the FPGA 50, a primary circuit is created at a first time slice, from the structural elements of the configurable circuit layer 54 of FIG. 4. This may include arranging configurable logic units 80 in certain order, configuring elements 82 within logic units 80, configuring I/O units 86, and/or configuring interconnections 84 in a predetermined order into the primary circuit, as is shown for example in FIG. 7. Upon creating the primary circuit, output data is read by the voting circuit 160 for further use in a majority voting step.

Upon the primary circuit has been configured, the unit 56 of FIG. 4 accomplishes the off-line search for unused resources of the configurable circuit layer 54 as will be described in detail further herein, and identifies the unused resources.

In the second time slice, following the first time slice, the memory slice A configures the unoccupied resources of the configurable circuit layer 54 identified during the off-line search into a first duplicate circuit functionally identical to the primary circuit, however based on structural elements having the least, preferably zero, overlap with the structural elements of the primary circuit. Similar to the first time slice, during the second time slice, the voting circuit 160 reads the output data of the first duplicate circuit for further majority voting.

The same sequence of operations, i.e., configuration of a duplicate circuit and testing, is repeated in each time slice, $1^{st}$ through $(N-1)^{th}$. As shown in FIG. 12, after the $N^{th}$ time slice, a time period 165 is allowed while still within the memory slice A for majority voting step performed by the voting circuit.

Upon completion of the function A, the "Select Slice" Control 66 (shown in FIG. 4), switches from the memory slice A to the memory slice B to specify function B of the FPGA 50. In accordance with the data contained in the memory slice B, the structural elements of the configurable circuit layer 54 of FIG. 4 are rearranged into configuration corresponding to the function B, as for instance, shown in FIG. 8. As shown in FIG. 12, during the memory slice B, the sequence of operations associated with the memory slice A, is repeated with the only difference that the primary circuit and all duplicate circuits configured within the memory slice B differ from the primary circuit and all duplicate circuits configured within the memory slice A, due to the difference of the functions B and A.

Although not shown in FIG. 12, it will be readily understood by those skilled in the art, that upon completion of the memory slice B, including fault tolerance checks, the FPGA may be switched to the memory slice C or any other memory slice identified in the memory layer 52 and the process is repeated.

There are several ways to identify and generate suitable redundant equivalent circuits on an off-line computer development system in accordance with the present invention. One of them, includes a linear "displacement" of the duplicate circuits with regard to previously configured circuits. For example, an FPGA application 170, shown in FIG. 13, includes an 8-bit register 172 connected to an AND gate 174, which forms a primary circuit 176 of the FPGA application 170 during a first time slice. During time slice 2, the FPGA 170 is dynamically reconfigured to an 8-bit register 178 and an AND gate 180 for forming a first duplicate circuit 182. The second configuration, i.e., the first duplicate circuit 182, purposely employs different FPGA resources, which are linearly displaced from the primary circuit 176, i.e., displaced laterally and vertically within the configuration circuit layer of the FPGA.

In this manner, the configuration of time slice 1 is independent of the configuration of time slice 2. Additionally, the spatial overlap between the resources used in the circuit 176 and the circuit 182 is substantially zero. In similar fashion, in a third time slice a second duplicate circuit (not shown) can be configured in order to obtain triple redundancy. The third configuration (the second duplicate circuit) would also be displaced linearly from the first and second configurations 176 and 128 for attaining spatial independence therewith. The external voting circuit 160 is coupled to the output of the AND gates 174 and 180 of the primary circuit 176 and the virtual copy 182 thereof to obtain a majority vote.

Figure 14C:
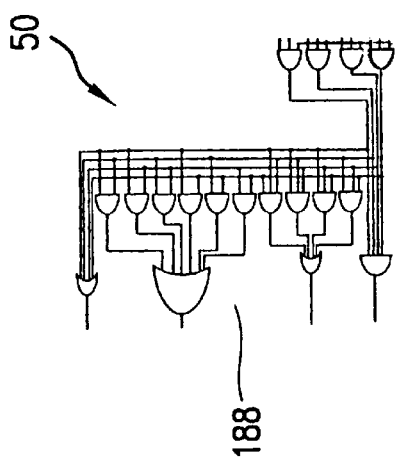
FIGS. 14A–14E show schematic representations of the rotationally displacement principle of the present invention.
Figure 14E:
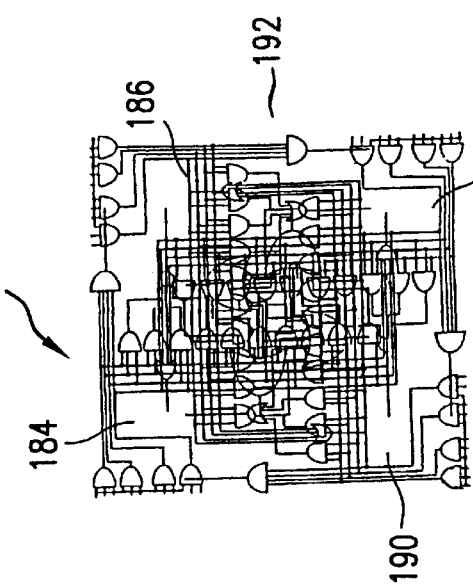
Figure 14B:
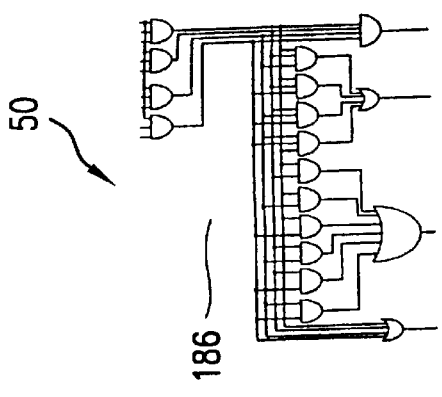
Figure 14D:
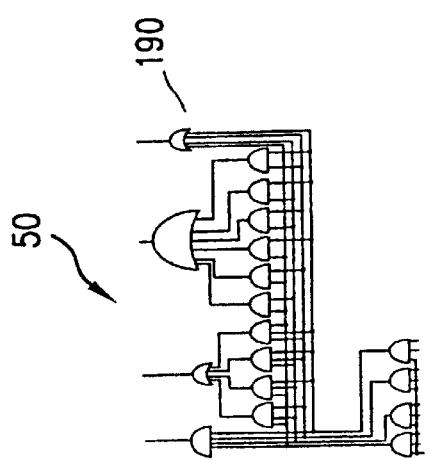
Figure 14A:
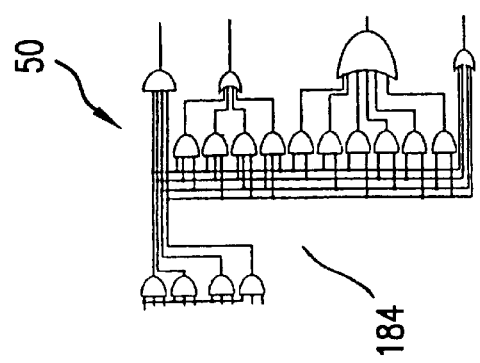

Another way to obtain redundant equivalent circuits during off-line development is shown in FIGS. 14A–14E, where the equivalent circuits are obtained by rotating the primary application circuit geometrically. A primary circuit 184 is formed, as shown in FIG. 14A. In the next time slice, shown in FIG. 14B, a first duplicate circuit 186 is obtained by 90°-clockwise rotation of the primary circuit 184. Similarly, a second duplicate circuit 188 is obtained by rotating the primary circuit 184, 180° clockwise, as shown in FIG. 14C. Further, a next duplicate copy 190 is obtained by a 270° clockwise rotation of the primary circuit 184, as shown in FIG. 14D. Thus, for quadruple redundancy, shown in FIGS. 14A–14D, four time slices are employed in the time multiplexing fashion. The external voting circuit 160 (shown in FIG. 4) is employed to obtain a majority vote of the outputs from the circuits 184–190. As shown in FIG. 14E, the central regions of the circuits 184, 186, 188 and 190 have overlapping resources between time slices. This means that in this particular example, the time slices are not totally independent each of the other, and therefore, a more sophisticated search for unoccupied resources is needed for rotational techniques.

Figure 15:
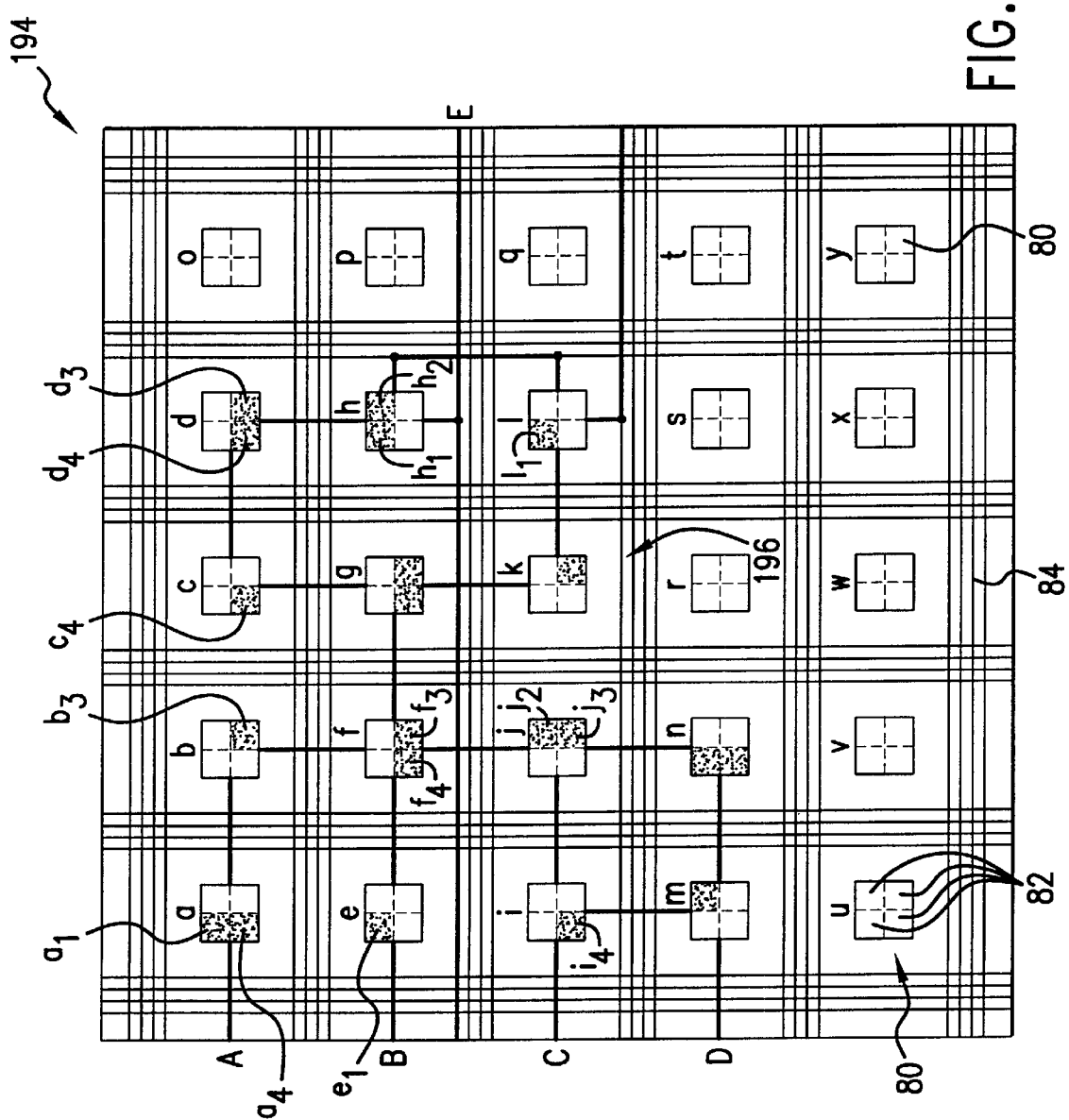
FIGS. 15–17 are schematic representations of fine grained FPGAs showing creation of duplicate circuits from substantially unoccupied configurable logic units, structural elements within each configurable logic unit, and routings for achieving the virtual redundancy technique of the present invention.
Figure 16:
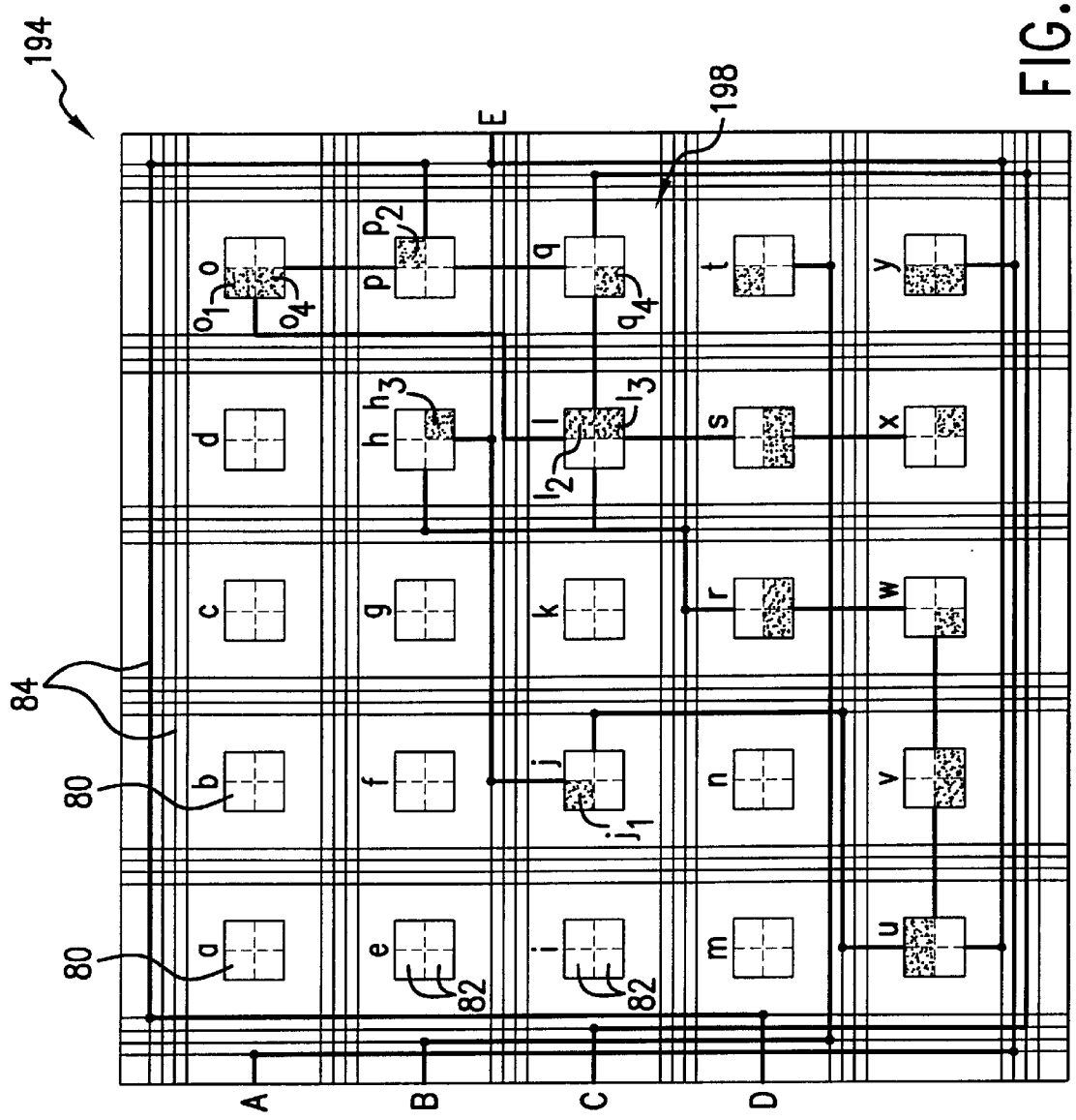
Figure 17:
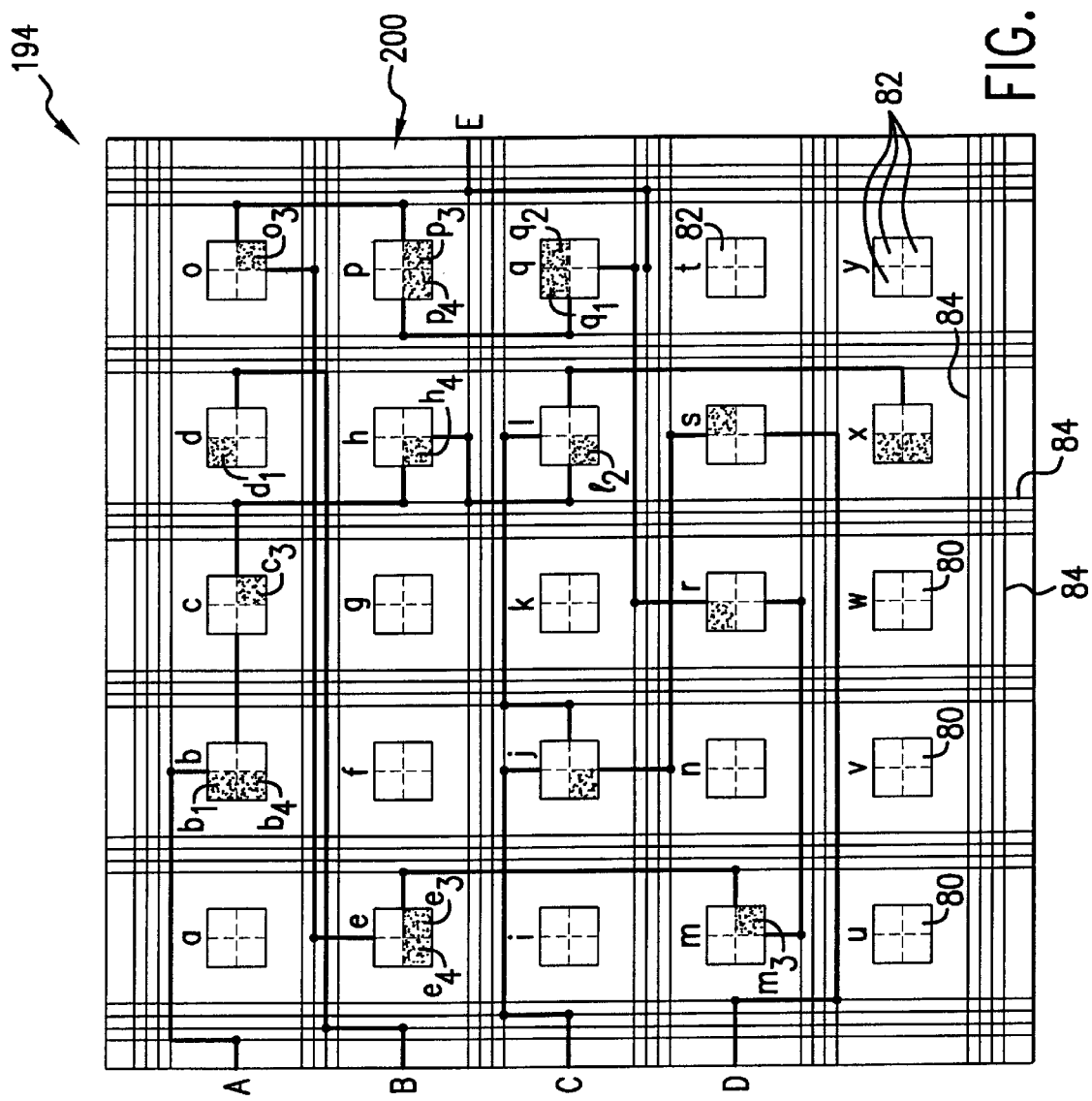

A fine grained FPGA 194 with 25 configurable logic units 80 and via paths (routing structure) 84 is shown in FIGS. 15–17. Each of the configurable logic units 80 includes elements 82 therewithin. As shown in FIG. 15, a primary circuit 196 is created in $1^{st}$ time slice, consisting of the configurable logic units a–n, in each of which only a portion of elements 82 are occupied. For example, in the logic unit a, the elements $a_1$ and $a_4$ are occupied; in unit b, the element $b_3$ is occupied; in the unit c, the element $c_4$ is occupied; in the unit d, the elements $d_3$ and $d_4$ are occupied; etc. Thus, out of 25 logic units 80, only 14 are used; and within the used configurable logic units 80, more than 50% of the elements 82 combined remain unoccupied. The same is true for the routing structure 84 where only a small portion of all interconnections is occupied by the primary circuit 194. The residual 11 configurable logic units 80 and interconnections 84 are referred to as unused resources while unoccupied elements 82 within each used configurable logic unit 80 are referred to as hidden resources.

If triple redundancy is desired, a primary circuit and two duplicate copies multiplexed in three time slices are formed. Each time slice will have a functionally equivalent circuit redundant to other equivalents. In practice, a computer program is used to search for suitable equivalents off-line, which may constitute a guided search, exhaustive search, or random search, as described further herein.

FIG. 16 shows a first duplicate circuit 198 created in the $2^{nd}$ nd time slice. In this first duplicate circuit 198 created on the fine grained FPGA 194, the structural elements of the FPGA are dynamically reconfigured so that to form a circuit functionally identical to the primary circuit 196 shown in FIG. 15, however containing the structural elements unoccupied by the primary circuit 196. Thus, configurable logic units o through y, which are unoccupied by the primary circuit 196 are used. However, these 11 configurable logic units are not a sufficient basis for functional identification to the primary circuit 196. Therefore, configurable logic units h, l, and j of the primary circuit 196 have been identified for the duplicate circuit 198. In these configurable logic units h, l, and j, however, structural elements 82 used for the duplicate circuit 198, specifically $h_3$, $l_2$, $l_3$, and $j_1$, are spatially independent from structural elements 82 of the primary circuit 196, particularly, $h_1$, $h_2$, $l_1$, $j_2$, and $j_3$. Thus, complete independence of the structural elements of the primary circuit 196 and the first duplicate circuit 198 is attained. The same structural independence is attained with respect to routing structure involved in the primary circuit 196 and the duplicate circuit 198.

In the third time slice, shown in FIG. 17, a second duplicate circuit 200 is configured in the fine grained FPGA 194, which is functionally identical to the primary circuit 196 (shown in FIG. 15) and to the duplicate circuit 198 (shown in FIG. 16). This duplicate circuit 200 includes configurable logic units b, c, d, e, h, j, l, m (common with the circuit 196) and o, p, q, r, s, and x (common with the circuit 198).

However, in the overlapped configurable logic units 80, the structural elements 82 employed for the primary circuit 196, first duplicate circuit 198, and the second duplicate circuit 200 are completely independent. For example, in the logic unit b, the primary circuit 196 uses the element $b_3$, while the second duplicate copy 200 uses elements $b_1$ and $b_4$; in the logic unit c, the element $c_4$ is used for the primary circuit 196, and the element $c_3$ for the duplicate copy 200; in the logic unit d, the elements $d_3$ and $d_4$ are used for the primary circuit 196 while for the second duplicate copy 200, the element $d_1$ is used. This remains true for all common configurable logic units. Therefore, the primary circuit 196, first duplicate circuit 198, and second duplicate circuit 200, are completely independent in terms of used resources of the FPGA 194.

It is readily understood by a person skilled in the art, that no redundant circuits are physically added to the FPGA to attain circuit redundancy and fault tolerance of the FPGA. All redundant copies are created from unoccupied structural elements of FPGA already existing in the FPGA by dynamic reconfiguration of the unused resources thereof. With this in mind, the method of circuit redundancy is called a "virtual" redundancy technique. The results achieved by the "virtual" redundancy technique of the present invention are similar to those which could be achieved by physical addition of redundant structural elements as has been done in prior known fault tolerant systems. Therefore, the technique of the present invention, by avoiding a build-up of additional structural elements, eliminates the cost, volume, weight, power, and thermal issues of the conventional fault tolerant systems. Thus, the virtual redundancy technique of the present invention is highly applicable for practical designs where it is not possible to provide fully separate and independent physical duplicates, either within mega FPGAs or in multi-chips arrangement.

The primary circuit and the duplicate circuits being independent are called orthogonal equivalents. There are several algorithms developed for finding orthogonal equivalents.

All algorithms are run on the off-line development unit 56 (shown in FIG. 4), which consists of an off-line computer workstation and development software tools for identifying the primary and duplicate configurations used by the FPGA target 50. In each memory slice, 68, 70 or 72, the unit 56 needs to be run once for the identification process. For this reason unit 56 is operated off-line and does not need to operate in a "real-time" fashion, while the FPGA 50 is required to support real-time processing. Although other arrangements are possible, it is preferred for aerospace applications, to use the workstation (unit) 56 positioned on the ground for being operatively coupled to FPGAs 50 aboard the spacecraft.

Unit 56 is a commercial off-the-shelf FPGA design software product from such companies as Mentor Graphics of Wilsonville, Oreg., or Synopsis of Mountain View, Calif. These commercial design products may be employed directly with no modification for the design virtual redundancy of the present invention; or it is possible to adapt these commercial products to yield a fully automatic design system for "virtual redundancy" of the present invention. For a large FPGA application, the design development of "virtual redundancy" may require hours of off-line computing. Once optimum configurations have been found for the primary circuit and duplicates, they are uploaded into the appropriate memory slices of the FPGA target through the channel 60 (shown in FIG. 4), and then multiplexed for the life cycle of the application defined in the respective memory slice 68, 70, or 72.

There are numerous commercially available design software capable of running on the unit 56 for finding duplicate equivalent circuits having minimal overlap. For example Altera Corporation of San Jose, Calif. recently released their PowerFit™ software, which yields significantly improved design configurations.

Commercial FPGA design software typically includes the following sub-systems:

Circuit Input where either a schematic or a behavioral model is input in a hardware description language (HDL), Constraint Inputs which permit the user to specify critical timing constraints, physical partitions for valid FPGA areas to use, I/O pin assignments, and specific circuit locations for certain critical sections of the design, Placement, Routing, and Fitting. This sub-system of modern development systems automatically places components within the FPGA defined positions and automatically interconnect the components using the router. More advanced development systems automatically check timing and, if necessary, make adjustments to the placing and routing procedure;

Verification software which allows to automatically validate timing performance during the placing and routing procedure.

Two algorithms for finding minimum overlapping equivalents can be employed in the system of the present invention. The first one utilizes commercial off-the-shelf FPGA software and significant manual effort. The second one utilizes custom FPGA software and is largely automatic thus requiring no manual effort.

The first algorithm starts by checking if the intended application is suitable for the given FPGA. It is important that the "virtual redundancy" is applied to FPGAs having the appropriate range of unused resources. This range is constrained by upper and lower bounds. At the upper bound, when unused resources are substantially large, full parallel redundancy may be feasible thereby invalidating the need for time multiplexing the FPGA. At the lower bound, an FPGA may have very limited resources such that the virtual equivalents contain large unwanted overlap. "Virtual redundancy" is appropriate in the middle range. Thus, in the first step, the algorithm is to check that FPGA resources are a correct match for the "virtual redundancy" implementation.

Assuming the application and FPGA resources are suitable for "virtual redundancy", the next step is to estimate how much overlap will occur in the virtual equivalents. Based on the estimate, the software in the unit 56 must decide which section of the circuits (primary and duplicates) will be overlapped.

The third step is to generate HDL (hardware description language) for the non-overlap portion of the circuit. This HDL is then copied for each of the required duplicates. The HDL copies are finally given unique label names so they are not mistook with the primary HDL.

The fourth step is to submit all of the above HDL to the compiler (HDL for non-overlap primary, HDL for non-overlap of first duplicate, HDL for non-overlap of second duplicate, etc.). The compiler treats the combined HDL as one complete parallel circuit and outputs the place and routing for the composite circuit.

The fifth step is to separate the place and route output from the fourth step for the primary, 1st duplicate, and 2nd duplicate, etc. (this is largely a manual task).

The sixth step is to define the HDL for the overlap region of the circuit.

In the seventh step, the compiler is operated in incremental mode. First, the place and route for the primary non-overlapped circuit is submitted. Then the compiler is requested to add the HDL for primary overlap circuitry. The compiler then outputs the place and route for the entire primary circuit (non-overlap and overlap regions). The resulting place and route forms the final configuration file for the first virtual equivalent.

The eighth step is to repeat step 7 for the first duplicate.
The ninth step is to repeat step 7 for the second duplicate.
This procedure is repeated until all duplicate circuits are analyzed.

To reduce the amount of manual effort, a custom algorithm is needed for the "virtual redundancy" implementation. This algorithm requests an adaptation of the commercial software to the specifics of "virtual redundancy" technique. The flow chart shown in FIG. 18 shows the major processing steps of such a customized algorithm, which is run off-line in unit 56.

Figure 18:
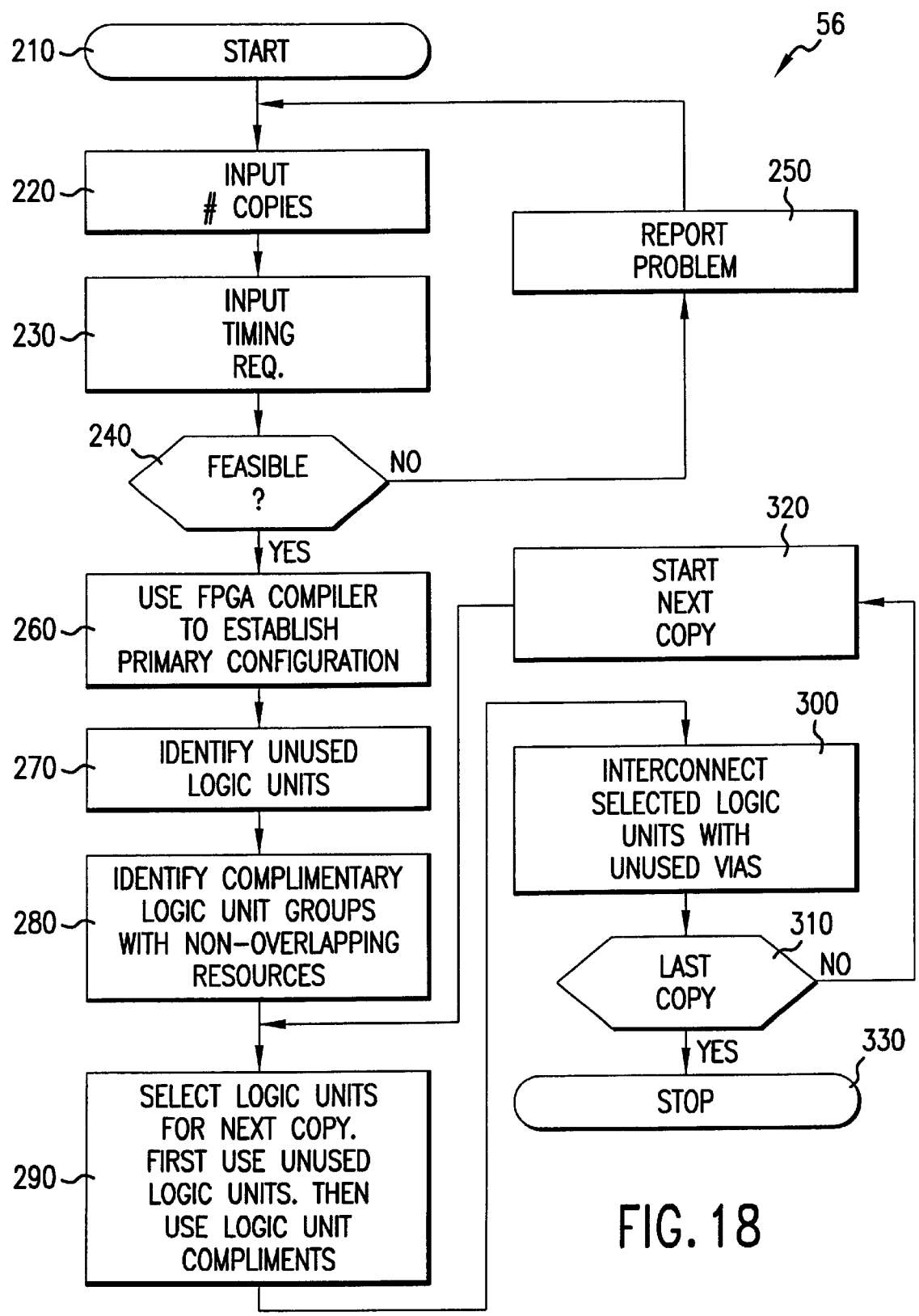
FIG. 18 is a flow chart diagram of an algorithm for finding orthogonal equivalents in accordance with the present invention.

As shown in FIG. 18, starting with the logic unit 210, the flow chart proceeds to the logic block 220 "Input Number Copies", where an operator inputs a desired number of redundant copies. After receiving the number of copies, the flow chart passes to the block 230 "Input Tiring Requirement", where the software running in the unit 56 requests timing requirements affordable for a particular application. Upon the timing requirements have been input by the operator, the software verifies in the block 240 if the desired number of copies is feasible for the given timing requirements. If the requirements are in disagreement, the program reports problems in the block 250 and returns to the block 220, where the operator inputs a different number of copies, more appropriate for the timing requirement. If the input number of copies and timing requirements are in agreement, the logic flows to the block 260 "Use FPGA Compiler to Establish Primary Configuration", where the program involves an FPGA compiler and obtains a configuration for the primary circuit copy. It is possible to use standard compiler options in the technique of the present invention.

Upon configuring the primary circuit, the software flows to logic block 270 "Identify Unused Logic Units" in which the software running in the unit 56 searches for all unused resources, i.e., the unused configurable logic units 80. Upon identifying all unused resources, the logic passes to the logic block 280 "Identify Complementary Logic Unit Groups with Non-Overlapping Resources" where the software identifies hidden resources, i.e., configurable logic units 80 common with the other redundant copies, however, in which non-occupied structural elements 82 are available as described with regard to FIGS. 15–17.

Based on unused logic units and hidden resources (i.e., complementary logic units having non-overlapping structural elements therewithin), a full set of configurable logic units usable for generation of the duplicate copies are selected. From block 280, the logic flows to the block 290 "Select Logic Units for Next Copy. First Use A New Logic Unit. Then Use Logic Units Complements", where, based on unused logic units and complementary logic units, a full set of logic units are selected. Upon selecting unused and hidden resources, the software flows to the block 300 "Interconnect Selected Logic Units with Unused Vias", where the software involves a router for interconnecting the logic units in a specific order. The router is programmed to select unused vias (interconnections) 84.

The process of selecting unused and hidden resources and interconnecting the selected resources with unused interconnections is reiterated for all needed virtual copies, the number of which was entered into the software in the logic block 220. Each time a duplicate circuit is configured in block 300, the software passes to the logic block 310 "Last Copy" to determine whether more copies are to be configured. If more copies are to be formed, i.e., the answer is "No", the logic flows to the block 320 "Start Next Copy" and returns to the block 290 for selecting another group of unused and hidden resources. If, however, the last copy was generated in block 310, the software passes to the "Stop" block 330, where the process of generating a virtual redundancy is completed.

The virtual redundancy technique is advantageous due to the high speed of reconfiguration which is in the range of microseconds, allowed by memory slicing of the FPGA capable of time multiplexing reconfigurations of logic units.

Alternative algorithms for finding orthogonal equivalents, involves an exhaustive search of all possible equivalents in a FPGA. For typical applications, there may be hundreds or even thousands of different equivalents which are identified in an exhaustive search and examined for the extent of common resources. This is referred to as a quantified intersection of two equivalents, shown as a matrix in FIG. 19. For example, the intersection of equivalent $e_1$ and $e_2$ is zero, meaning there is no common resources between the equivalents. The intersection of equivalent $e_0$ and $e_4$ is 0.05, meaning that there is 5% overlap between these two equivalents. Since the matrix of FIG. 19 having intersection of various equivalents is symmetric, and the diagonals have all 1's (since self-intersection is always 1), it is possible to reduce the matrix by removing the diagonal and all numbers below thereof as shown in FIG. 20. Finally, as shown in FIG. 21, the best equivalent sets are selected using max.-min. criteria. It is admitted that zero intersection is not possible for certain applications, however, in these cases, the algorithm selects the least possible finite intersection between the elements.

It is clear that multiplexing in FPGA requires time. For double redundancy, for example, the overall time needed for circuit evaluation is at least doubled in comparison with situations when double redundancy is not performed. For triple redundancy, the overall time will be at least tripled. Therefore, a virtual redundancy technique is best suited for applications having generous timing margins. In addition to added time for each multiplex copy, there is additional delay resulting from the longer via paths.

For a given FPGA application, there are typically multiple ways to implement the application design for the same functionality. Designers typically select the fastest design which has the shortest via lengths. When applying the virtual redundancy method, designers specify the allowable worst case circuit delays allowed. This timing margin permits other configurations to be used in the FPGA. It is clear that the larger the timing margin, the greater the number of circuit variations possible. Such timing margins depend on the application. For example, a high speed DSP (digital signal processing) application supporting fiber optic communication may have limited timing margins, whereas, an expert rule processing system may have large timing margins. Finally, as the speed of FPGAs improve, the timing margins will correspondingly increase. To summarize, application timing margin specifications limit the number of circuit equivalents. Therefore, as the timing margins increase, virtual redundancy techniques will become more practical to implement.

The unused and hidden resources may be estimated. With contemporary technology, FPGA design cores are available for various RISC (reduced instruction set computer), various DSP (digital signal processing) filters, and various peripheral interfaces. By comparing the number of structural elements for example transistors, needed for a particular FPGA design core, to the equivalent ASIC design, an estimate of unused hidden resources may be established. Disadvantageously, these resources are scattered throughout the FPGA in a fragmented fashion. The virtual redundancy technique is able to exploit fractional residual space left in the FPGA at the completion of a design and also the hidden fragmented hidden space in the FPGA.

Whenever the redundant copies are utilized, a decision must be made as to which copies are correct. The voting circuit 160 thus is a critical element of the fault tolerance technique in any system. It is impossible to provide a completely redundant voting circuit directly on the FPGA chip since due to the fact that all output lines from primary and duplicate circuits must come to a single decision point, they all will intersect which is impermissible for all redundancy techniques. Therefore, the best strategy for fault tolerance, is to implement the voting circuit off the FPGA chip, and to make the voting circuit robust in terms of its implementation, i.e., use hard-radiation semiconductor materials with shielding.

In order to keep the voting circuit as simple as possible, each duplicate copy should provide summary data rather than exhaustive data. For example, when voting on duplicate CPU, key CPU registers such as the memory address registers may be used.

Typically in voting, lock step arrangement is employed. That is, for each step and process, the summary registers are compared by the voting circuit. If they agree, the next step is initiated, in which again, the summary registers are checked. Therefore, each process step is checked and in this way, faults may be detected as early as possible.

The virtual redundancy technique of the present invention may include FPGA applications in which substantially 100% of FPGA is time-multiplexed; also, in some FPGA applications only a section of the FPGA may be time-multiplexed. For example, 70% of an FPGA configuration can be static and only 30% can be time multiplexed for the purpose of virtual redundancy.

For example, recently manufacturers have produced a chip in which the CPU is a non-configurable "hard-core" alongside a configurable FPGA section, called a "soft-core". Virtual redundancy may be applied to the embedded FPGA "soft-core" in exactly the same fashion as to a stand-alone FPGA.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A method for creating circuit redundancy in programmable logic devices, comprising the steps of:
    (a) establishing a programmable logic device containing a plurality of structural elements,
    (b) configuring a first portion of said plurality of structural elements at a first time slice into a primary circuit for a predetermined application,
    (c) identifying at least a second portion of said plurality of structural elements having the least overlap with the structural elements of said first portion thereof,
    (d) configuring said structural elements at a second time slice of said at least second portion thereof into a duplicate circuit substantially functionally identical with respect to said primary circuit, and
    (e) comparing performance of said primary circuit and said duplicate circuit in a time-multiplexing fashion.

2. The method of claim 1, wherein said structural elements include configurable logic units of said programmable logic device.

3. The method of claim 2, wherein said structural elements further include structural elements within each of said configurable logic units.

4. The method of claim 3, further comprising the step of:
in said step (c), including into said at least one second portion of the structural elements unoccupied, configurable logic units, and, upon exhaustion thereof, unoccupied structural elements within occupied configurable logic units.

5. The method of claim 1, wherein said structural elements include interconnections formed on said programmable logic device.

6. The method of claim 1, wherein said structural elements include I/O units of said programmable logic device.

7. The method of claim 1, wherein said first portion of said plurality of structural elements includes one configurable logic unit, and wherein said at least second portion of said plurality of structural elements includes at least a further configurable logic unit spatially separated from said one configurable logic unit.

8. The method of claim 1, further comprising the step of:
in said step (c), identifying said at least one second portion of the structural elements as linearly displaced with regard to said first portion of the structural elements.

9. The method of claim 1, further comprising the step of:
in said step (c), identifying said at least a second portion of the structural elements as spatially rotated with regard to said first portion of the structural elements.

10. The method of claim 1, further comprising the steps of:
identifying a plurality of time slices,
identifying a number of said at least one second portions of unoccupied structural elements, and
configuring each of said number of at least one second portions of the unoccupied structural elements into a duplicate circuit at a respective one of said plurality of time slices.

11. The method of claim 10, further comprising the step of:
identifying time margins for said plurality of time slices.

12. The method of claim 11, further comprising the step of determining a feasibility of said number of said second portions and said time margins for said plurality of the time slices.

13. The method of claim 1, further comprising the step of:
excluding from operation a defective one of said primary circuit and said duplicate circuit, upon detecting in said step (e) a disagreement in performance of said primary circuit and said duplicate circuit.

14. The method of claim 13, further comprising the step of:
upon completing the steps (a)–(e) for said predetermined application,
repeating said steps (a)–(e) for a different predetermined application.

15. The method of claim 1, wherein said overlap between the structural elements included into said primary circuit and the structural elements included into said duplicate circuit is substantially zero overlap.

16. The method of claim 1, wherein said programmable logic device includes a field programmable gate array.

17. A method for creating fault tolerance in programmable logic devices, comprising the steps of:
configuring at a first time slice, a primary group of a plurality of structural elements of a programmable logic device into a primary circuit for a predetermined application;
defining a plurality of sequential time slices following said first time slice;
identifying in each of said time slices a respective $N^{th}$ duplicate group of said plurality of the structural elements;
configuring said respective duplicate group of the structural elements into a duplicate circuit substantially functionally identical to said primary circuit;
comparing performance of said primary circuit and said duplicate circuit in time-multiplexing fashion; and
excluding at least one of said primary circuit and said duplicate circuit from operation subsequent to disagreement in performance being detected in said comparing step.

18. The method of claim 17, wherein said $N \geq 1$.

19. The method of claim 17, wherein said $N^{th}$ duplicate group of said plurality of the structural elements has the least spatial overlap with said primary group and with any of $(N-1)^{th}$ duplicate groups.

20. The claim 17, wherein said time slices have a duration in a range of microseconds.

21. The method of claim 17, wherein said structural elements include configurable logic units of said programmable logic device.

22. The method of claim 21, wherein said structural elements further include structural elements within each said configurable logic unit.

23. The method of claim 22, further comprising the steps of:
identifying said respective duplicate group of the structural elements by
a) selecting unoccupied configurable logic units; and upon exhaustion thereof, by
b) selecting unoccupied structural elements within occupied configurable logic units.

24. The method of claim 22, wherein said structural elements further include interconnections formed on said programmable logic device.

25. The method of claim 17, wherein said structural elements include I/O units of said programmable logic device.

26. The method of claim 17, further comprising the steps of:
defining a plurality of sequential application cycles, each cycle corresponding to a respective application,
in each of said application cycles, configuring a respective primary circuit and N duplicate circuits substantially identical functionally to said respective primary circuit, and
comparing performance thereof in time-multiplexing fashion.

27. A programmable logic device with fault tolerance, comprising:
a plurality of configurable structural elements;
means for defining a plurality of time slices,
configuration means containing configuration data and coupled to said configurable structural elements for:
(a) configuring a primary group thereof into a primary circuit in a $1^{st}$ time slice of said plurality of time slices, and (b) configuring an N$^{th}$ duplicate group of the configurable structural elements into a duplicate circuit substantially functionally identical to said primary circuit in a (N+1)$^{th}$ time slice of said plurality of time slices, wherein N≧1;

means for identifying said N$^{th}$ duplicate group of the configurable structural elements having the least overlap with the configurable structural elements occupied in said primary circuit and in any of (N-1) duplicate circuits; and voting means for interrogating said primary circuit and said duplicate circuits in time-multiplexing fashion for comparing performance thereof.

28. The programmable logic device of claim 27, wherein said identifying means are adapted for off-line searching of said N$^{th}$ duplicate group of the structural elements.

29. The programmable logic device of claim 27, wherein said the least overlap is substantially zero.

30. The programmable logic device of claim 27, further comprising means for excluding from operation at least one defective of said primary circuit and said duplicate circuits once disagreement in performance thereof has been detected, and said voting means identified the defective circuit.

31. The programmable logic device of claim 27, further comprising a chip containing said plurality of configurable structural elements, said time slices defining means, said configuration means, and said means for identifying said duplicate groups of the configurable structural elements, wherein said voting means is located off said chip.

32. The programmable logic device of claim 31, wherein said chip further contains a section of non-reconfigurable structural elements.

33. The programmable logic device of claim 27, wherein said configurable structural elements include logic units.

34. The programmable logic device of claim 33, wherein said configurable structural elements further include configurable routing structure.

35. The programmable logic device of claim 33, wherein said configurable structural elements further include structural elements within each of said logic units.

36. The programmable logic device of claim 35, wherein said duplicate group identifying means further comprises means for initially searching for unoccupied logic units, and, upon exhaustion thereof, searching for unoccupied structural elements within occupied logic units.

37. The programmable logic device of claim 27, wherein said configuration means comprises memory means including a plurality of memory slices, each memory slice containing respective configuration data specifying a function to be performed by said programmable logic device at a predetermined time period.

38. The programmable logic device of claim 37, wherein said identifying means are further operationally coupled to said memory means.

39. The programmable logic device of claim 37, further comprising sequencer means coupled to said memory means for actuating said memory slices in a predetermined time-multiplexing fashion.

40. The programmable logic device of claim 39, wherein said sequencer means actuates in sequence a next memory slice of said memory means upon said primary circuit and said duplicate circuits having been created and interrogated by said voting means during operation of a previous actuated memory slice.

41. The programmable logic device of claim 39, wherein during actuation of each of said plurality of the memory slices, said configuration memory means configure a respective primary group of the configurable structural elements into a primary circuit for performing a function specified in said actuated memory slice, and further configure in non-overlapping fashion a plurality of respective duplicate groups into duplicate circuits functionally identical to said respective primary circuit.

42. The programmable logic device of claim 27, further comprising means for identifying a number of said duplicate circuits to be configured in time-multiplexing fashion.

43. The programmable logic device of claim 42, further comprising means for identifying timing requirements for said programmable logic device for a function to be performed.

44. The programmable logic device of claim 43, further comprising means for determining feasibility of said number of said duplicate circuits in view of said timing requirements.

45. The programmable logic device of claim 27, including a field programmable gate array.

46. A method for creating circuit redundancy in field programmable gate array (FPGA), comprising the steps of:

in a FPGA containing a plurality of configurable structural elements, a) defining a plurality of time slices, and b) configuring, in a time-multiplexing fashion, a plurality of functionally substantially identical circuits from the structural elements of said FPGA having the least overlap with the structural elements occupied in any previous of said plurality of time slices.

47. The method of claim 46, further comprising the steps of:

providing voting means, and interrogating and comparing performance of said plurality of functionally identical circuits to detect a defective circuit.

* * * * *